United States Patent
Mizukami et al.

(10) Patent No.: US 8,227,811 B2
(45) Date of Patent: Jul. 24, 2012

(54) SEMICONDUCTOR RECTIFYING DEVICE

(75) Inventors: Makoto Mizukami, Kanagawa (JP); Johji Nishio, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/036,940

(22) Filed: Feb. 28, 2011

(65) Prior Publication Data
US 2012/0056197 A1   Mar. 8, 2012

(30) Foreign Application Priority Data
Sep. 8, 2010   (JP) ................................. 2010-200832

(51) Int. Cl.
*H01L 31/0312* (2006.01)

(52) U.S. Cl. ... 257/77; 257/472; 257/485; 257/E29.148; 257/E29.338

(58) Field of Classification Search ............... 257/77, 257/471, 472, 476, 480, 481, 485, E29.148, 257/E29.338
See application file for complete search history.

(56) References Cited

U.S. PATENT DOCUMENTS
2007/0278609 A1   12/2007   Harris et al.

OTHER PUBLICATIONS
U.S. Appl. No. 13/220,107, filed Aug. 29, 2011, Mizukami.
U.S. Appl. No. 12/716,386, filed Mar. 3, 2010, Mizukami et al.
M. Skowronski, et al., "Degradation of hexagonal silicon-carbide-based bipolar devices", Journal of Applied Physics, 99, 011101, 2006, pp. 011101-1 to 011101-24.

*Primary Examiner* — Matthew E Warren
(74) *Attorney, Agent, or Firm* — Oblon, Spivak, McClelland, Maier & Neustadt, L.L.P.

(57) ABSTRACT

A wide bandgap semiconductor rectifying device of an embodiment includes a first-conductive-type wide bandgap semiconductor substrate and a first-conductive-type semiconductor layer that has an impurity concentration lower than that of the substrate. The device also includes a first-conductive-type first semiconductor region, and a second-conductive-type second semiconductor region that is formed between the first regions. The device also includes second-conductive-type third semiconductor regions in which at least part of the third regions are connected to the second wide bandgap semiconductor region, the third regions being formed between the first regions, the third regions having a width narrower than that of the second region. The device also includes a first electrode and a second electrode. In the device, a direction in which a longitudinal direction of the third regions are projected onto a (0001) plane of the layer has an angle of 90±30 degrees with respect to a <11-20> direction of the layer. A gap between the third regions is not lower than $2d \times \tan 18°$, where d is a thickness of the layer.

20 Claims, 23 Drawing Sheets

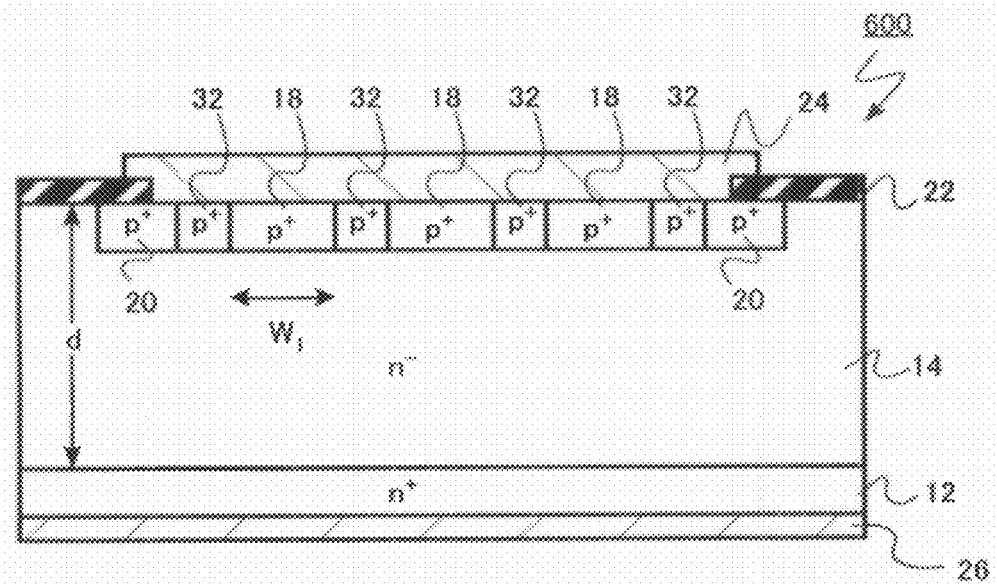
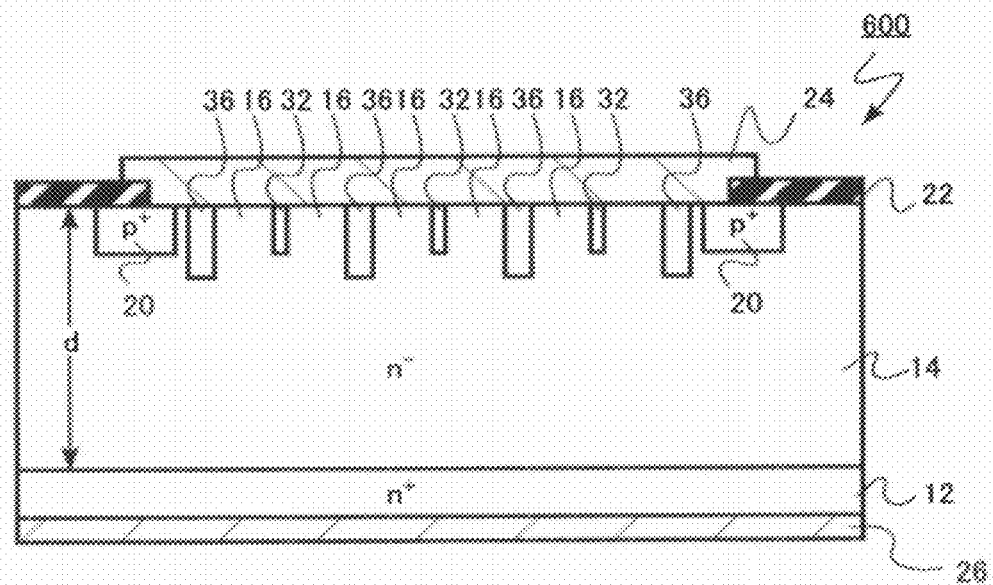

SEMICONDUCTOR RECTIFYING DEVICE

CROSS-REFERENCE TO RELATED APPLICATION

This application is based upon and claims the benefit of priority from Japanese Patent Application No. 2010-200832, filed on Sep. 8, 2010, the entire contents of which are incorporated herein by reference.

FIELD

Embodiments described herein relate generally to a semiconductor rectifying device.

BACKGROUND

In a semiconductor rectifying device that rectifies an input current to output the rectified current, there are a Pin diode having a pn junction and a Schottky barrier diode (SBD) having a carrier potential barrier of a difference in work function between a semiconductor layer and metal. In the Schottky barrier diode, there is a JBS (Junction Barrier Schottky barrier diode) in which an impurity region (for example, p type) having a conductive type different from that of the semiconductor layer (for example, n type) is disposed at a surface of the semiconductor layer in order to relax an electric field applied to an interface between the semiconductor layer and the metal. There is also an MPS (Merged PiN-diode Schottky-diode). In the MPS, the contact between the impurity region (for example, p type) and the metal of the JBS is set to or brought close to ohmic connection, and a minority carrier is injected to decrease a resistance by conductivity modulation when a voltage exceeding a built-in potential (Vbi) between the impurity region and the semiconductor layer.

On the other hand, a wide bandgap semiconductor such as silicon carbide (hereinafter also referred to as SiC) is expected as a next-generation power semiconductor device. The wide bandgap semiconductor has a wide bandgap, higher breakdown field strength, and higher thermal conductivity compared with Si Silicon). A low power-loss power semiconductor device operable at high temperature can be realized utilizing the characteristics of the wide bandgap semiconductor.

In the MPS, by decreasing a voltage at which conductivity modulation is generated, a low resistance of a forward characteristic is realized, and a large amount of current can be ejected at a low forward voltage when a forward surge current flows. When a current larger than that of a steady state flows, the current causes a crystal breakdown and a junction breakdown due to heat generation under an equation of current× voltage=energy. However, when the large amount of current is passed at the low forward voltage, heat generation energy can be suppressed to decrease an device destruction ratio.

For the SiC diode in which the conductivity modulation is generated by a minority carrier, a Stacking Fault (SF) that is a plane defect is generated by energy of electron/hole plasma recombination while originating on a Basal Plain Dislocation (BPD) propagating from an SiC substrate to an epitaxial layer, thereby degrading the forward characteristic. That is, when the stacking fault is generated, the carrier is trapped to decrease an on-state current of the diode.

BRIEF DESCRIPTION OF THE DRAWINGS

FIG. 24A and FIG. 24B are views explaining action of the semiconductor rectifying device of the fifth embodiment;

DETAILED DESCRIPTION

Figure 1:
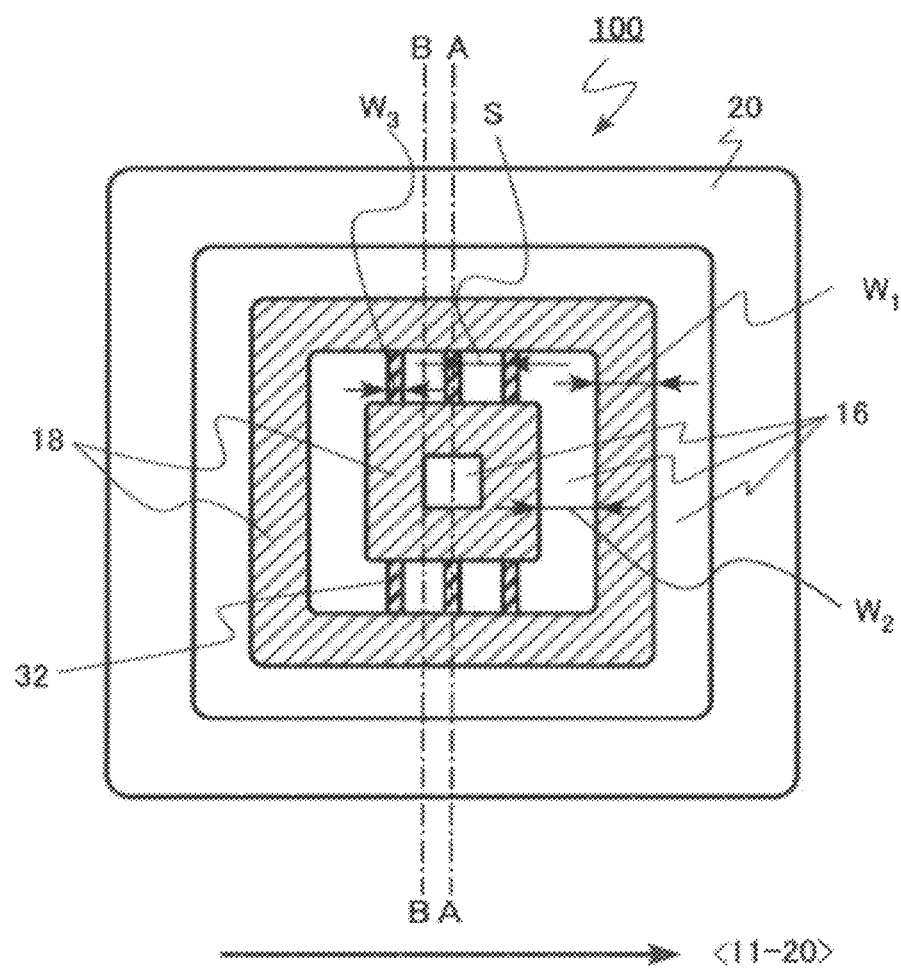
FIG. 1 is a plan view of a semiconductor rectifying device according to a first embodiment.

A semiconductor rectifying device of an embodiment includes a hexagonal first-conductive-type wide bandgap semiconductor substrate (a semiconductor substrate) and a hexagonal first-conductive-type wide bandgap semiconductor layer (a first layer) that is formed on an upper surface of the wide bandgap semiconductor substrate, the wide bandgap semiconductor layer having an impurity concentration lower than that of the wide bandgap semiconductor substrate. The semiconductor rectifying device also includes a first-conductive-type first wide bandgap semiconductor region (first semiconductor region) that is formed at or in a surface of the wide bandgap semiconductor layer and a second-conductive-type second wide bandgap semiconductor region (second semiconductor region) that is formed while sandwiched (interposed) between the first wide bandgap semiconductor regions. The semiconductor rectifying device also includes a plurality of second-conductive-type third wide bandgap semiconductor regions (third semiconductor regions) in which at least part of the third wide bandgap semiconductor region is connected to the second wide bandgap semiconductor region, the third wide bandgap semiconductor region being formed while sandwiched (interposed) between the first wide bandgap semiconductor regions, the third wide bandgap semiconductor region having a width narrower than that of the second wide bandgap semiconductor region. The semiconductor rectifying device also includes a first electrode that is formed on the first and second wide bandgap semiconductor regions and a second electrode that is formed on a lower surface of the wide bandgap semiconductor substrate. In the semiconductor rectifying device, a direction in which a longitudinal direction of the third wide bandgap semiconductor regions are projected onto a (0001) plane of the first-conductive-type wide bandgap semiconductor layer has an angle of 90±30 degrees with respect to a <11-20> direction of the first-conductive-type wide bandgap semiconductor layer. A gap (or distance) between the third wide bandgap semiconductor regions is not lower than 2d×tan 18°, where d is a thickness of the first-conductive-type wide bandgap semiconductor layer.

As used herein, a width of a semiconductor region means a shortest distance from one point in an end portion of a graphic defining the semiconductor region to another end portion located across the semiconductor region from the one point. For example, when the semiconductor region width is not lower than 15 μm, the width is not lower than 15 μm in the end portion of at least 50% of the graphic defining the semiconductor region.

First Embodiment

A semiconductor rectifying device of a first embodiment includes a hexagonal first-conductive-type wide bandgap semiconductor substrate and a hexagonal first-conductive-type wide bandgap semiconductor layer that is formed on an upper surface of the wide bandgap semiconductor substrate, the wide bandgap semiconductor layer having an impurity concentration lower than that of the wide bandgap semiconductor substrate. The semiconductor rectifying device also includes a first-conductive-type first wide bandgap semiconductor region that is formed at or in a surface of the wide bandgap semiconductor layer and a second-conductive-type second wide bandgap semiconductor region that is formed while sandwiched (or interposed) between the first wide bandgap semiconductor regions. The semiconductor rectifying device also includes a plurality of second-conductive-type third wide bandgap semiconductor regions in which at least part of the third wide bandgap semiconductor regions are connected to the second wide bandgap semiconductor region, the third wide bandgap semiconductor regions being formed while sandwiched (interposed) between the first wide bandgap semiconductor regions, the third wide bandgap semiconductor regions having width narrower than that of the second wide bandgap semiconductor region. The semiconductor rectifying device also includes a first electrode that is formed on the first and second wide bandgap semiconductor regions and a second electrode that is formed on a lower surface of the wide bandgap semiconductor substrate.

In the semiconductor rectifying device, a direction in which a longitudinal direction of the third wide bandgap semiconductor regions are projected onto a (0001) plane of the first-conductive-type wide bandgap semiconductor layer has an angle of 90±30 degrees with respect to a <11-20> direction of the first-conductive-type wide bandgap semiconductor layer. A gap between the third wide bandgap semiconductor regions is not lower than 2d×tan 18° where d is a thickness of the first-conductive-type wide bandgap semiconductor layer.

According to the semiconductor rectifying device of the first embodiment having the above-described configuration, the third wide bandgap semiconductor regions act as a propagation region of a hole generated in the second wide bandgap semiconductor region. Accordingly, the hole injection can be dispersed in a wide range of an element (or a device) activation region (or activation area). Therefore, the heat generation region of the element can be dispersed to decrease a percent defective caused by the forward surge current.

A region where the hole is generated is controlled in the element by restricting the longitudinal direction of the third wide bandgap semiconductor regions and the gap between the third wide bandgap semiconductor regions, which allows the suppression of the growth of the stacking fault (SF) caused by the basal plain dislocation (BPD). Therefore, the degradation of the forward characteristic caused by a device operation can be suppressed to improve reliability of the device.

The <11-20> direction of the first-conductive-type wide bandgap semiconductor layer means a direction crystallographically equivalent to <11-20> and a direction from the surface side (semiconductor region side) of the first-conductive-type wide bandgap semiconductor layer toward the back side (substrate side).

The MPS, in which the wide bandgap semiconductor is silicon carbide (hereinafter also referred to as SiC), the first conductive type is an n type, and the second conductive type is a p type, will be described below by way of example.

Figure 2A:
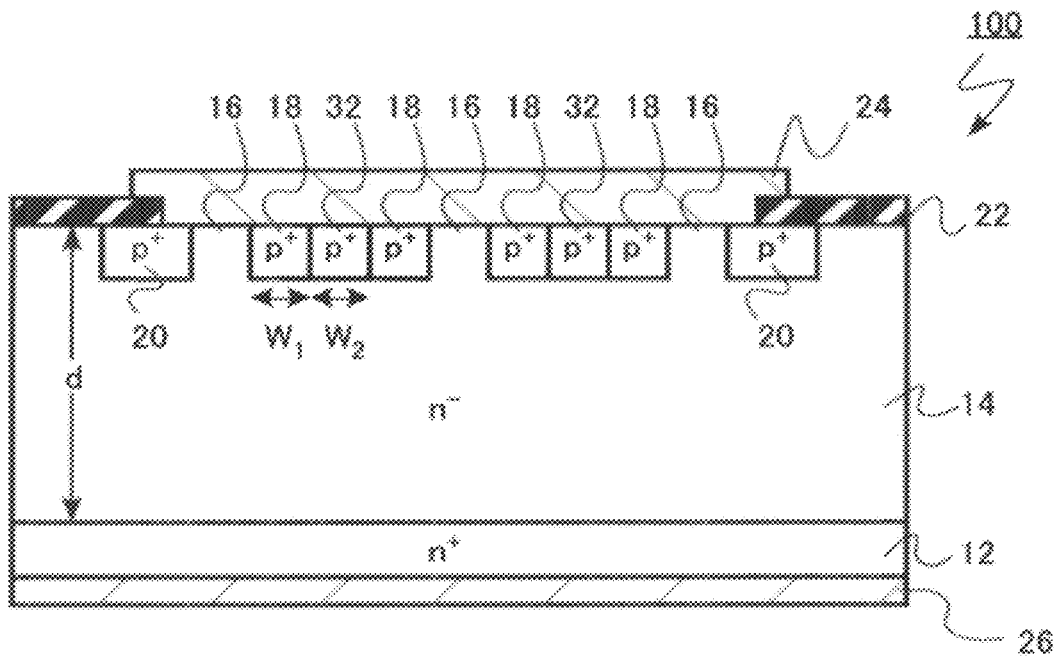
FIG. 2A and FIG. 2B are sectional views of the semiconductor rectifying device of the first embodiment.
Figure 2B:
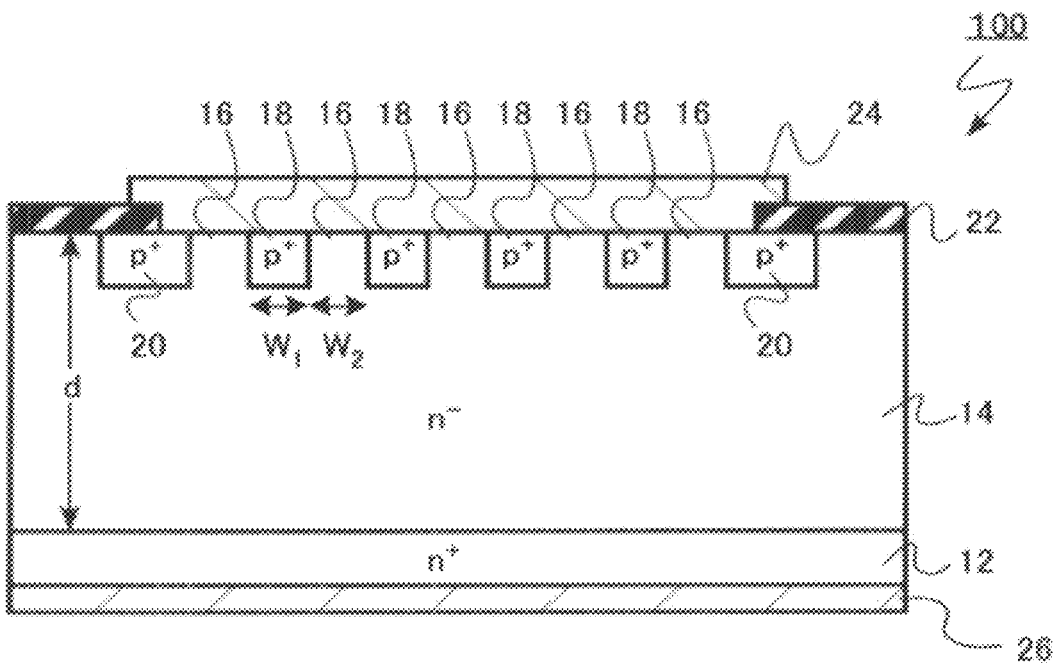

FIG. 1 and FIG. 2 are a plan view and a sectional view schematically illustrating the MPS that is the semiconductor rectifying device of this embodiment. FIG. 2A is a sectional view taken on a line AA of FIG. 1, and FIG. 2B is a sectional view taken on a line BB of FIG. 1.

As illustrated in FIG. 2, in an MPS 100 of the first embodiment, an n− type SiC layer 14 is formed as a drift layer on an upper surface of a hexagonal n+ type 4H—SiC substrate 12.

For example, the 4H—SiC substrate 12 and the n− type SiC layer 14 contains N (nitrogen) as an impurity.

The n+ type 4H—SiC substrate 12 is a low-resistance substrate having an impurity concentration of, for example, 5E+18 to 1E+19 atoms/cm$^3$. For example, the n− type SiC layer 14 has an impurity concentration of 1E+14 atoms/cm$^3$ to 5E+16 atoms/cm$^3$ and a thickness (d in FIG. 1) of 20 μm or more.

For example, the n+ type 4H—SiC substrate 12 and the n− type SiC layer 14 have an off angle of 4 to 8 degrees with respect to <11-20> of SiC.

The MPS 100 is an MPS whose required breakdown voltage ranges from 3000 V to 7000 V, that is, a so-called high-breakdown-voltage MPS of a 3000-V class to a 7000-V class. Desirably the n− type SiC layer 14 has the above-described impurity concentration and thickness in order to realize the high breakdown voltage and the sufficient on-state current density.

An n type impurity region (n type Schottky region) 16 exists in the surface of the n− type SiC layer 14. The n type impurity region 16 corresponds to the upper portion of the n− type SiC layer 14.

A p+ type impurity region 18 is formed while sandwiched between the n type impurity regions 16. In the p+ type impurity region 18, for example, Al (aluminum) or B (boron) of about 1E+18 atoms/cm$^3$~2E+20 atoms/cm$^3$ is contained as the impurity. Hereinafter the p+ type impurity region 18 is also referred to as a hole generation region.

For example, the p+ type impurity region 18 has a depth of about 0.3 to about 1.0 μm. For example, the p+ type impurity region 18 has a width ($W_1$ in the drawings) of 15 μm or more. Desirably the p+ type impurity region 18 has a concentration as high as possible from the viewpoint that a characteristic of a junction to the first electrode is put into ohmic or brought close to ohmic. Although, when the p+ type impurity region 18 is formed by an ion-implantation, crystal defects remained close to pn junction may degrade minority carrier injection rate. To avoid this problem, an impurity concentration profile that has selectively high concentration at contact region to an electrode and low concentration at a region close to pn junction may be applied.

When the width ($W_1$ in the drawings) of the p+ type impurity region 18 is lower than 15 μm, the hole injection voltage is insufficiently decreased to possibly degrade the resistance characteristic against the forward surge current.

A RESURF region 20 made of first-conductive-type wide bandgap semiconductor is formed at a surface of the semiconductor layer. The RESURF region 20 is formed on the outside of the p+ type impurity region 18 while one of the n type impurity regions 16 is sandwiched between the RESURF region 20 and one of the p+ type impurity regions 18. The RESURF region 20 is wider than the p+ type impurity region 18, and has the impurity concentration and depth, which are substantially equal to those of the p+ type impurity region 18. The RESURF region is provided in order to stabilize the breakdown voltage of the MPS.

The surface of the n− type SiC layer 14 is coated with an insulating film 22 made of, for example, a silicon oxide film. A first electrode (anode electrode) 24 made of, for example, Ni is formed in an opening of the insulating film 22 so as to be joined to the n type impurity region 16 and the p+ type impurity region 18. The first electrode (anode electrode) 24 is formed so as to be also in contact with part of the surface of the RESURF region 20. A second electrode (cathode electrode) 26 made of, for example, Ni is formed in the lower surface of the n+ type 4H—SiC substrate 12.

When the MPS 100 is viewed from above, as illustrated in FIG. 1, the n type impurity region 16 is located in the innermost portion, the p+ type impurity regions 18 having the widths $W_1$ and the n type impurity regions 16 having the widths $W_2$ are alternately formed toward the outer periphery side. In the first embodiment, the two square p+ type impurity regions 18 having the substantially constant width $W_1$ are formed while having the same center.

A RESURF region 20 is formed on the outside of the n type impurity region 16 of the outermost periphery so as to surround the n type impurity region 16 of the outermost periphery. The n type impurity region 16 and the p+ type impurity region 18, which are surrounded by the RESURF region 20, are the MPS active region.

The MPS 100 of the first embodiment includes a plurality of p+ type propagation regions 32. In the p+ type propagation region 32, both ends are connected to the p+ type impurity regions 18, and the width is smaller than that of the p+ type impurity region 18. The propagation region 32 is sandwiched between the n type impurity regions 16.

Figure 3A:
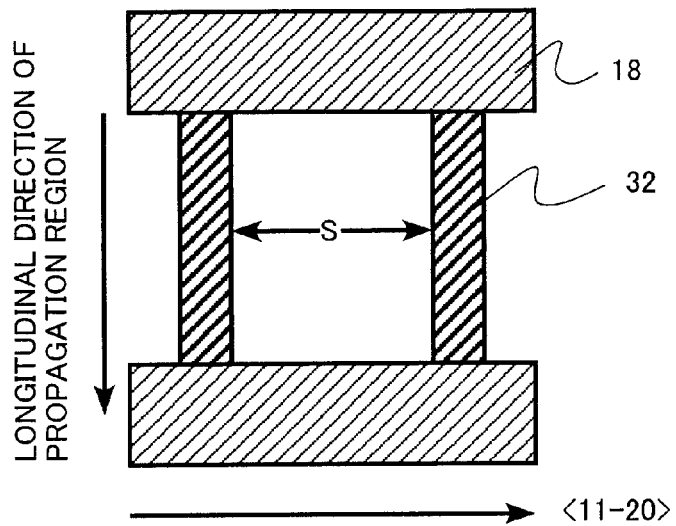
FIG. 3A and FIG. 3B are explanatory views of a propagation region of the first embodiment.
Figure 3B:
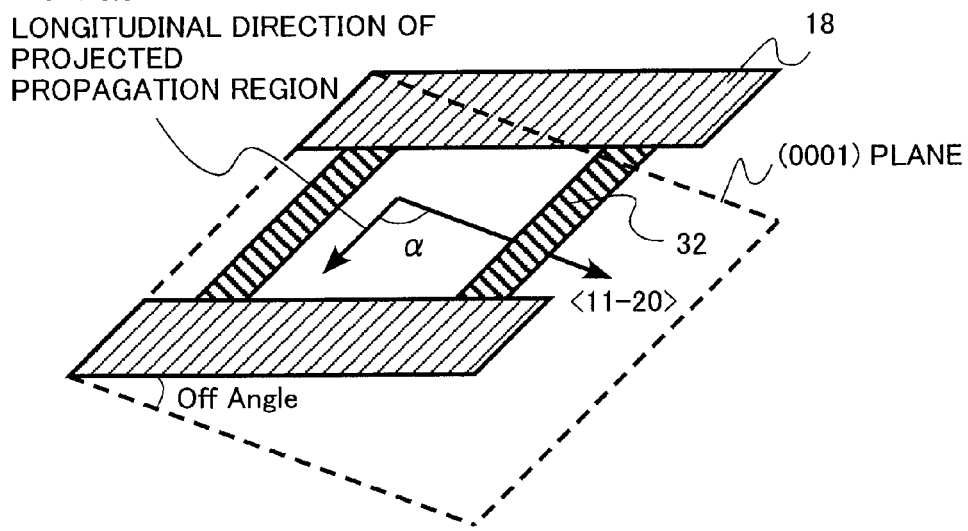

FIG. 3 is an explanatory view of the propagation region 32. FIG. 3A is a plan view of the propagation region 32, and FIG. 3B is a perspective view. The direction in which the longitudinal direction of the p+ type propagation region 32 is projected onto the (0001) plane of the n− type SiC layer 14 has the angle of 90±30 degrees with respect to the <11-20> direction of the n− type SiC layer 14. Assuming that d is a thickness of the n− type SiC layer 14 (see FIG. 2), a gap (S in FIG. 1 and FIG. 3A) between the p+ type propagation regions 32 is not lower than 2d×tan 18°.

Similarly to the p+ type impurity region 18, the propagation region 32 is formed by ion implantation of Al or B. For example, the propagation region 32 has the impurity concentration of about 1E+18 atoms/cm$^3$ and the depth of about 0.3 to about 1.0 μm.

A method for producing the semiconductor rectifying device of the first embodiment illustrated in FIG. 1 and FIG. 2 will be described below. The n− type SiC layer 14 having the thickness (d in FIG. 2) of 20 μm or more is epitaxially formed on the upper surface of hexagonal n+ type 4H—SiC substrate 12.

Then, a mask member is patterned on the surface of the n− type SiC layer 14 by a lithography method. Al or B is ion-implanted using the patterned mask member. Then, the mask member is removed, the substrate is washed, and activation annealing is performed at a temperature of 1500° C. to 2000° C. Thus, the p+ type impurity region 18, the p+ type propagation region 32, and the RESURF region 20 are formed.

Then, by applying known methods, the first electrode (anode electrode) 24 and the second electrode (cathode electrode) 26 are formed.

Therefore, the MPS 100 illustrated in FIG. 1 and FIG. 2 can be produced by the above-described producing method.

Figure 4A:
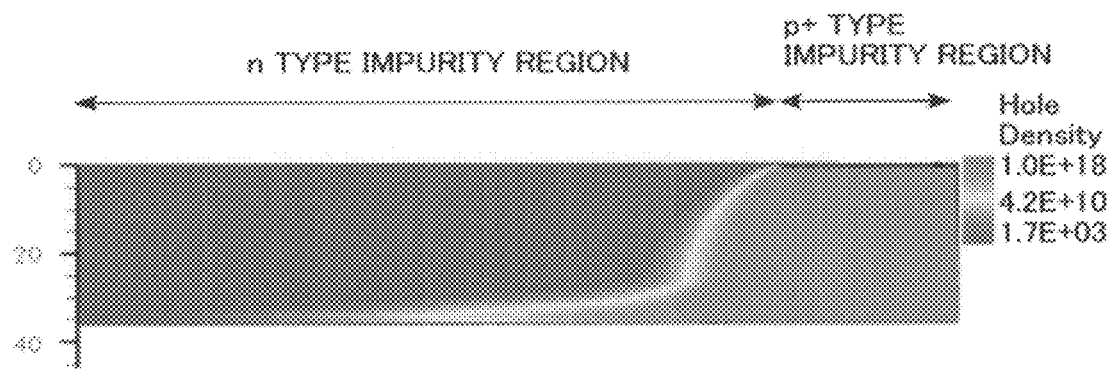
FIG. 4A and FIG. 4B are explanatory views illustrating hole propagation action of the semiconductor rectifying device of the first embodiment.

FIG. 4 is an explanatory view illustrating hole propagation action of the semiconductor rectifying device of the first embodiment. FIG. 4A is a view illustrating a distribution of a hole injection concentration by a simulation when a half width of the p+ type impurity region is set to 36 μm (total width of 72 μm) while a half width of the n type impurity region is set to 144 μm (total width of 288 μm) in the MPS in which the propagation region 32 does not exist.

As is clear from FIG. 4A, in the lower portion of the p+ type impurity region, although the hole is selectively injected, the hole does not reach the n type impurity region. Accordingly, when the forward surge current is generated, the region where the heat is generated is biased to a portion in which the p+ type impurity region exists. This causes local electrode peel-off or crystal breakdown to possibly increase the percent defective.

Figure 4B:
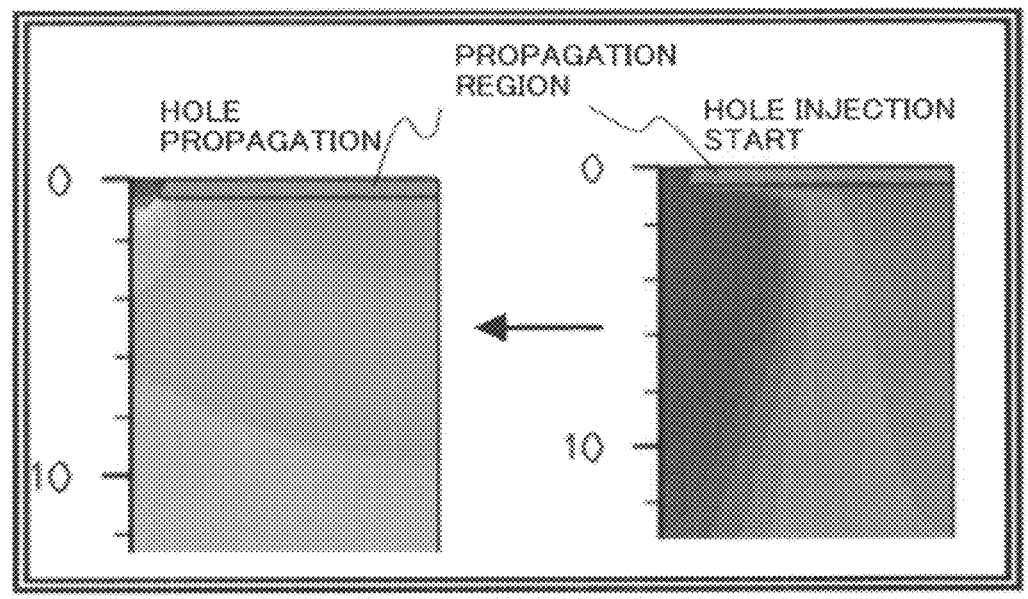

FIG. 4B is a view illustrating a distribution of the hole injection concentration by a simulation in the MPS of the first embodiment. As can be seen from FIG. 4B, when a voltage is applied between the anode electrode and the cathode electrode, the hole injection is started, the hole propagates in the propagation region, and the hole is evenly dispersed in the n− type SiC layer.

According to the first embodiment, the hole injection is dispersed in the wide range of the element activation region by providing the propagation region 32. Accordingly, the heat generation region can be dispersed to decrease the percent defective caused by the forward surge current.

A width ($W_3$) of the propagation region 32 is set narrower than the width ($W_1$) of the p+ type impurity region 18, which allows the suppression of the decrease in on-state current density caused by providing the propagation region 32. Even if the width of the propagation region 32 is lower than 15 μm that is of the desirable width of the p+ type impurity region 18, it is confirmed that the hole propagates and is injected even in the lower portion of the propagation region 32 by a plasma spreading effect from the p+ type impurity region 18.

Figure 5A:
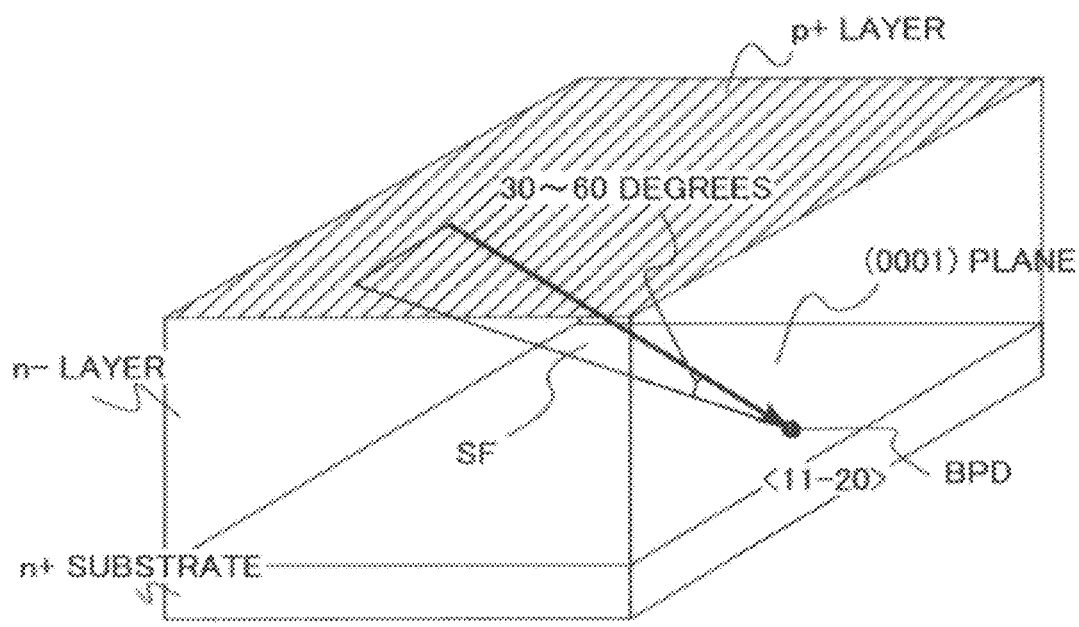
FIG. 5A, and FIG. 5B are explanatory views of generation of a stacking fault originating from BPD.
Figure 5B:
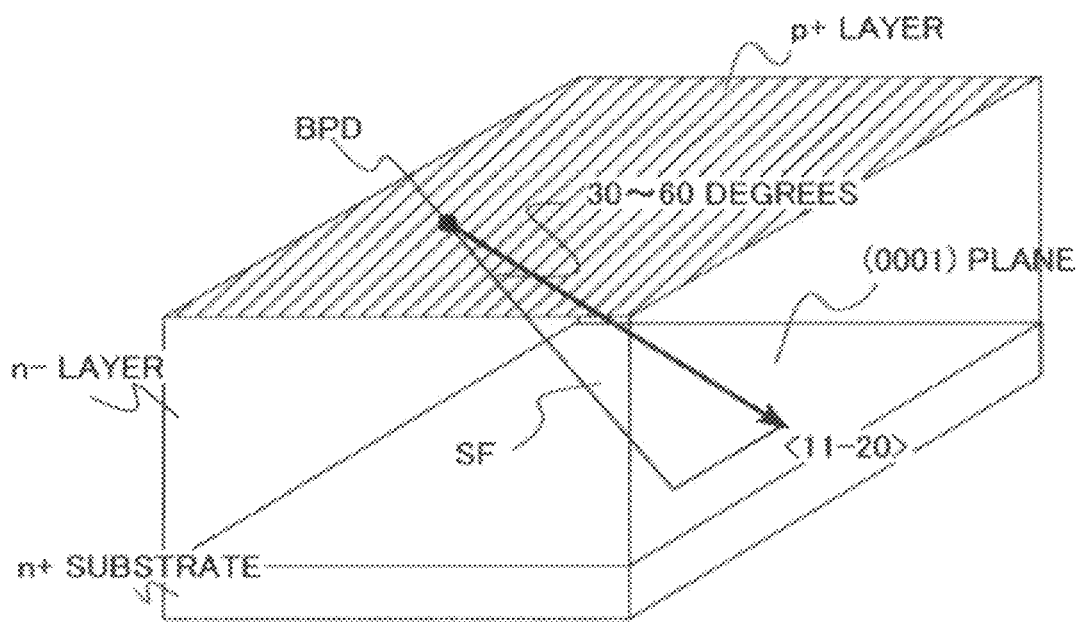

FIG. 5 is an explanatory view of generation of the stacking fault originating from the BPD. For example, when the basal plain dislocation (BPD) that is a line defect exists in a basal plane, it is well known that the stacking fault (SF) that is the plane defect is generated by energy of recombination of the hole generated by the diode operation and the electron, that is, the electron/hole plasma recombination. FIG. 5A shows the case, when the stacking fault extends from an interface between the substrate and the n− layer. FIG. 5B shows a case, when the stacking fault extends from an interface between the p+ type impurity region and the n− layer.

The stacking fault is spread and grown in a range of about 60 degrees in the <11-20> direction in the (0001) plane of the n− layer. The stacking fault may be spread and grown in a range between about 30 degrees to 60 degrees. A maximum range is about 60 degrees. Because the stacking fault acts as an electrically high resistance, unfortunately the forward current of the diode is decreased. Accordingly, when the stacking fault is generated in the MPS, the forward resistance is also increased to possibly suppress the reduction effect of the percent defective caused by the forward surge current.

Figure 6A:
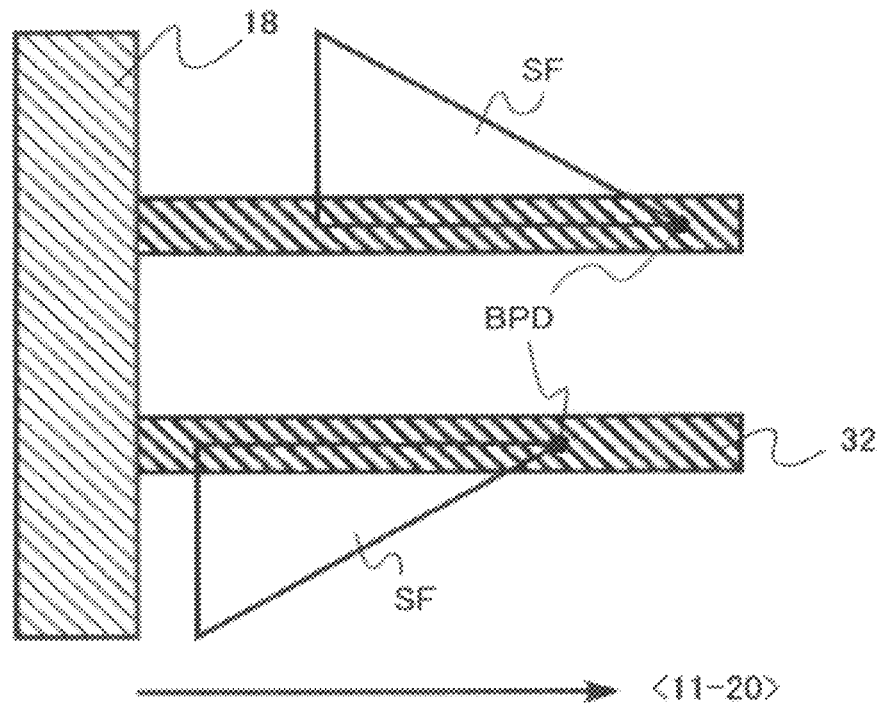
FIG. 6A and FIG. 6B are explanatory views illustrating stacking fault suppressing action of the semiconductor rectifying device of the first embodiment.
Figure 6B:
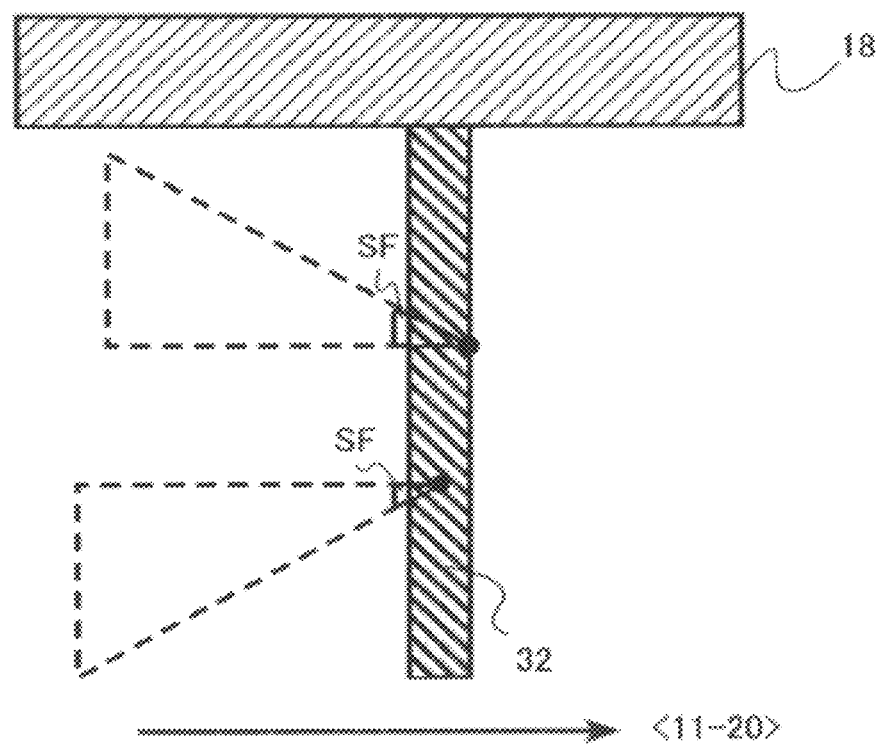

FIG. 6 is an explanatory view illustrating stacking fault suppressing action of the MPS of the first embodiment. FIG. 6A illustrates the stacking fault suppressing action when the longitudinal direction of the propagation region is provided parallel to <11-20>, and FIG. 6B illustrates the stacking fault suppressing action when the longitudinal direction of the propagation region is provided perpendicular to <11-20> similarly to the first embodiment.

As illustrated in FIG. 6A, when the longitudinal direction of the propagation region 32 is provided parallel to <11-20>, the hole is always supplied in the direction in which the stacking fault is spread, and the growth of the stacking fault is promoted. On the other hand, as illustrated in FIG. 6B, when the longitudinal direction of the propagation region 32 is provided perpendicular to <11-20>, the range where the hole is supplied is restricted with respect to the direction in which the stacking fault is spread, so that the growth of the stacking fault can be suppressed.

From the viewpoint that the growth of the stacking fault is suppressed, desirably the direction in which the longitudinal direction of the p+ type propagation region 32 is projected onto the (0001) plane of the n− type SiC layer 14 has the angle (angle corresponding α in FIG. 3A) of 90 degrees with respect to the <11-20> direction of the n− type SiC layer 14. Because the stacking fault is spread in the range of about 120 degrees by maximum with respect to the <11-20> direction, the suppression effect of the growth of the stacking fault is obtained when the direction in which the longitudinal direction of the p+ type propagation region 32 is projected onto the (0001) plane of the n− type SiC layer 14 has the angle of 90±30 degrees with respect to the <11-20> direction of the n− type SiC layer 14. The angle of 90±15 degrees is more preferable.

Figure 7A:
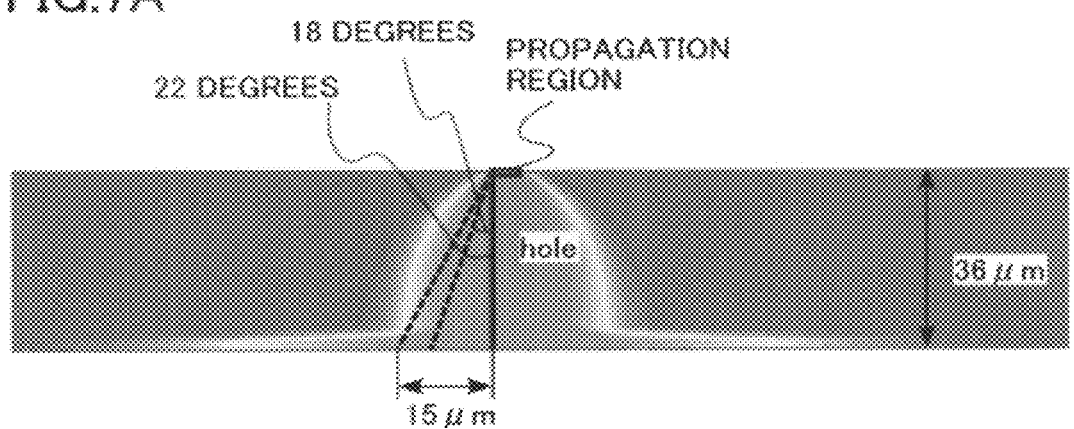
FIG. 7A and FIG. 7B are views illustrating simulation results of hole diffusion from the propagation region.
Figure 7B:
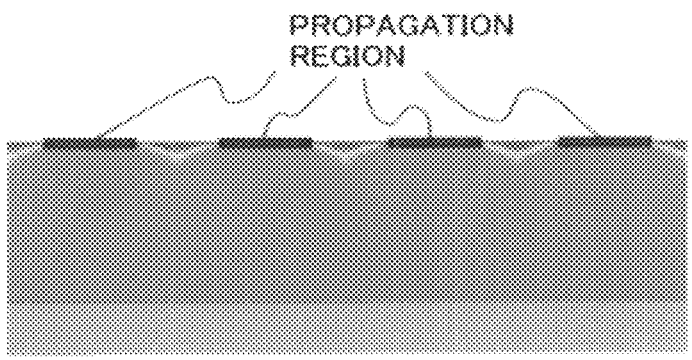

FIG. 7 is a view illustrating a simulation result of hole diffusion from the propagation region. FIG. 7A illustrates the simulation result for one propagation region, and FIG. 7B illustrates the simulation result when the plurality of propagation regions exists densely. As illustrated in FIG. 7A, during the operation of the MPS, a hole diffusion region is formed within a range of a constant width from the end portion of the p+ type propagation region.

At the end portion of the p+ type propagation region, the hole concentration is particularly high in the range of 18 degrees with respect to the direction normal to the surface of the p+ type propagation region, and the hole concentration is rapidly increased in the range of 22 degrees. FIG. 7A illustrates the case in which the n− type SiC layer has the thickness d of 36 μm, and the hole concentration is increased in the range of the width of 15 μm corresponding to d×tan 22° from the end portion of the propagation region 32.

Therefore, as illustrated in FIG. 7B, when the propagation regions are densely arrayed while the gap (S) between the propagation regions is shortened, the hole is supplied to the whole region of the n− type SiC layer, and the growth of the stacking fault cannot be suppressed even if the direction in which the longitudinal direction of the p+ type propagation region is projected onto the (0001) plane of the n− type SiC layer has the angle of 90 degrees with respect to the <11-20> direction of the n− type SiC layer.

Figure 8A:
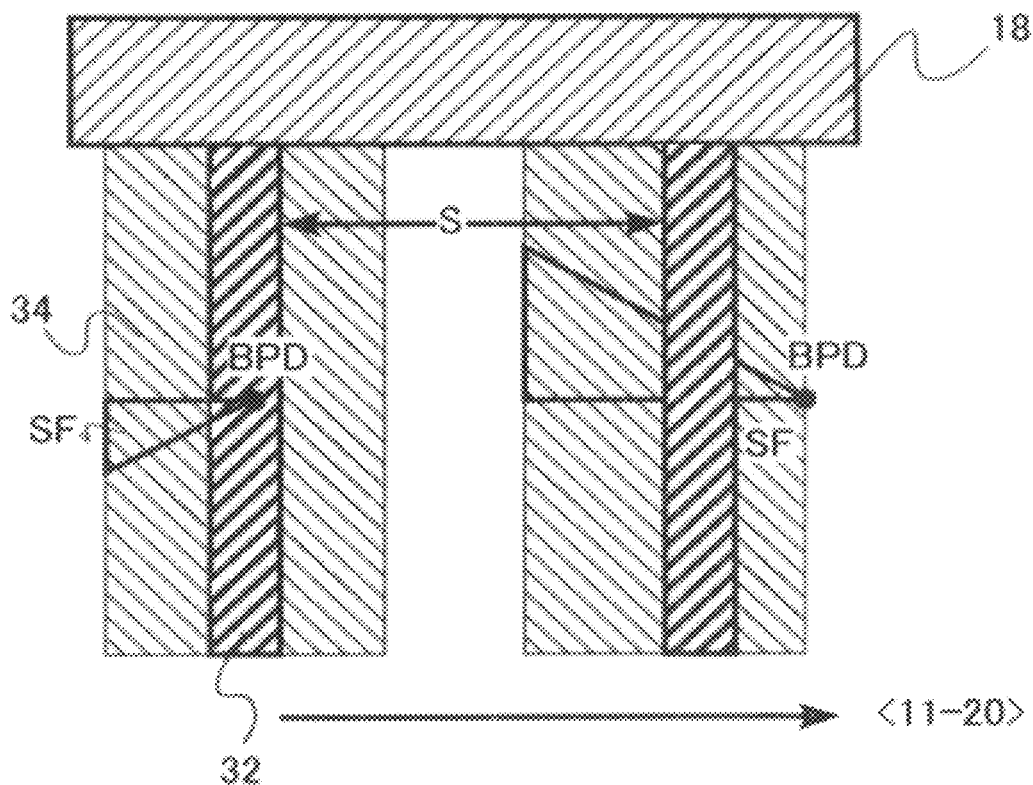
FIG. 8A and FIG. 8B are explanatory views illustrating the stacking fault suppressing action of the semiconductor rectifying device of the first embodiment.
Figure 8B:
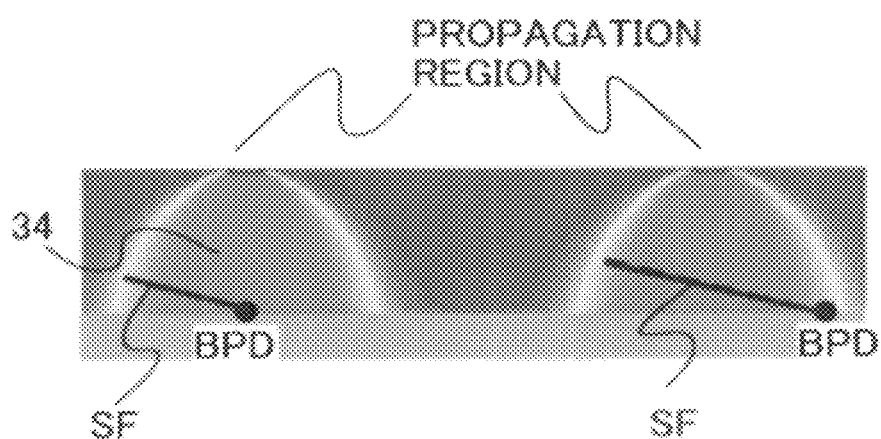

FIG. 8 is a view illustrating stacking fault suppressing action of the MPS of the first embodiment. FIG. 8A is a plan view of the MPS, and FIG. 8B is a view illustrating a simulation result of the hole diffusion from the propagation region.

In the first embodiment, assuming that d is the thickness of the n− type SiC layer 14, the gap (S) between the p+ type propagation regions 32 is set to 2d×tan 18° or more, desirably 2d×tan 22° or more. Therefore, as illustrated in FIG. 8A, a hole diffusion region 34 adjacent to the propagation region 32 is secured such that the hole diffusion regions 34 do not overlap each other.

Accordingly, as illustrated in FIG. 8B, the stacking fault is not grown as illustrated by a broken line in the region where the hole diffusion regions 34 do not overlap each other. Accordingly, the generation of the high-resistance region can be suppressed to effectively prevent the decrease in forward current.

In the MPS of the first embodiment, desirably the first-conductive-type wide bandgap semiconductor layer has the impurity concentration of 1E+14 atoms/cm³ to 5E+16 atoms/cm³ and the thickness of 20 μm or more. Desirably the second wide bandgap semiconductor region has the width of 15 μm or more.

Generally, in the MPS, the low resistance of the forward characteristic is realized by decreasing the voltage at which the conductivity modulation is generated, and the large amount of current can be ejected at the low forward voltage when the forward surge current flows. When the current larger than that of the steady state flows, the current causes the crystal breakdown and the junction breakdown such as the electrode due to heat generation under the equation of current×voltage=energy. However, when the large amount of current is passed at the low forward voltage, the heat generation energy can be suppressed to decrease the element destruction ratio.

However, the inventors found that the voltage at which the conductivity modulation is generated by injecting the minority carrier (hereinafter referred to as hole injection voltage when the minority carrier is the hole) is insufficiently decreased in the MPS, in which the wide bandgap semiconductor is used and the required breakdown voltage is 3000 V (hereinafter also referred to as a 3000-V class) or more.

In the conventional MPS, the minority carrier is injected by applying the voltage of +1 V or less with respect to Vbi. For example, in the conventional Si MPS, the conductivity modulation is generated at the voltage of 1 to 1.5 V with respect to Vbi of 0.8 to 1.0 V of Si. In the conventional SiC MPS, with respect to Vbi of 2.5 to 3.0 V of SiC, the conductivity modulation is generated at the voltage of about 3.2 V for the 600-V-class high-voltage element and the voltage of about 4 V for the 1200-V-class high-voltage element (SiC MPS: p+ type impurity region width of 2 μm, n type Schottky region width of 0.8 μm, temperature of 125° C.).

In the MPS, because the p+ type impurity region becomes a dead space in passing an electron current (majority carrier), generally the p+ type impurity region width is narrowed. Therefore, for example, it is assumed that the p+ type impurity region width is set to 1 μm, and it is assumed that the n type impurity region width (n type Schottky region width) is set to 1 μm. When the hole injection voltage of MPS is computed at 125° C., the hole injection voltage becomes 4.4 V for the 600-V class, 6.9 V for the 1200-V class, 10.85 V for the 3300-V class, and 13.53 V for the 4500-V class. Accordingly, in the high-breakdown-voltage element of the 3300-V class or more, the low-resistance by the conductivity modulation cannot be expected because the hole injection voltage becomes four times or more the hole injection voltage of the PiN diode.

Figure 9:
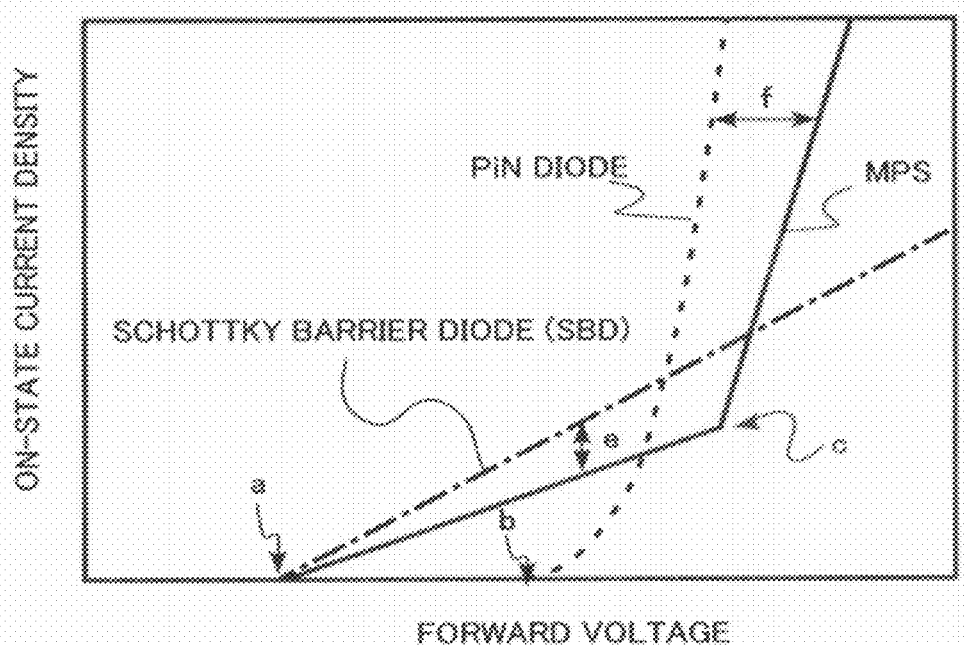
FIG. 9 is an explanatory view of a relationship between a forward voltage and on-state current density in various semiconductor rectifying devices.

FIG. 9 is an explanatory view of a relationship between a forward voltage and on-state current density in various semiconductor rectifying devices. The on-state current density of SBD, illustrated by an alternate long and short dash line, rises at the voltage illustrated by an arrow a. The rise voltage is determined by a Schottky barrier height (φB) of a Schottky junction between the anode electrode and the n type impurity region.

On the other hand, the on-state current density of the PiN diode, illustrated by a dotted line, rises at the voltage illustrated by an arrow b. The rise voltage is determined by the built-in potential (Vbi) of the pn junction.

For the MPS including both the Schottky junction and the pn junction, the on-state current density illustrated by a solid line rises at the voltage illustrated by the arrow a, and the conductivity modulation is generated to steeply increase the on-state current density at the voltage at which the hole injection illustrated by an arrow c is generated, that is, when the voltage reaches the hole injection voltage. The heat generation energy is suppressed by decreasing the hole injection voltage, and therefore the destruction ratio of the element can be reduced when the forward surge current is generated.

A on-state current density difference between the MPS and the SBD, illustrated by a two-headed arrow e, is increased with increasing ratio of an area of the p+ type impurity region provided in the MPS. A on-state current density difference between the MPS and the PiN diode, illustrated by a two-headed arrow f, is decreased with increasing ratio of the area of the p+ type impurity region.

Figure 10:
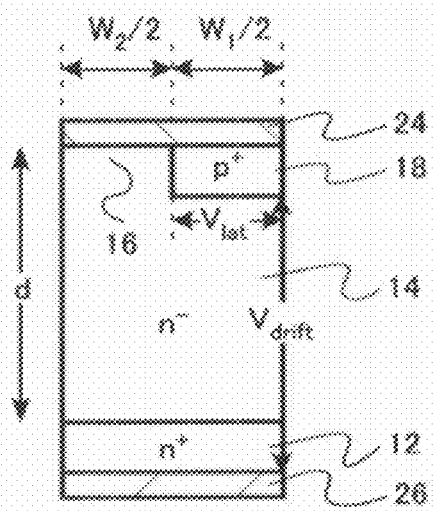
FIG. 10 is a sectional view illustrating a structure of a semiconductor rectifying device used in the simulation.

FIG. 10 is a sectional view illustrating a structure of a semiconductor rectifying device used in the simulation of a current-voltage characteristic. It is assumed that a unit structure is a half pitch of a repetition of the n type impurity region 16 and the p+ type impurity region 18 in the MPS active region.

$W_1/2$ is a half width of the p+ type impurity region 18, and $W_2/2$ is a half width of the n type impurity region 16. d is a thickness of the n− type SiC layer 14 that is the drift layer. A voltage distribution is obtained by a simulation immediately before a voltage is applied between the first electrode (anode electrode) 24 and the second electrode (cathode electrode) 26 to inject the minority carrier from the p+ type impurity region 18 into the n− type SiC layer 14.

It is assumed that $V_{drift}$ (two-headed arrow in FIG. 10) is a voltage drop, obtained from the simulation result, from the lower surface of the SiC substrate 12 to the bottom surface of the p+ type impurity region 18. It is assumed that $V_{lat}$ (two-headed arrow in FIG. 10) is a voltage drop from the end portion of the p+ type impurity region 18 to a center portion in the width direction of the bottom surface of the p+ type impurity region 18.

Figure 11:
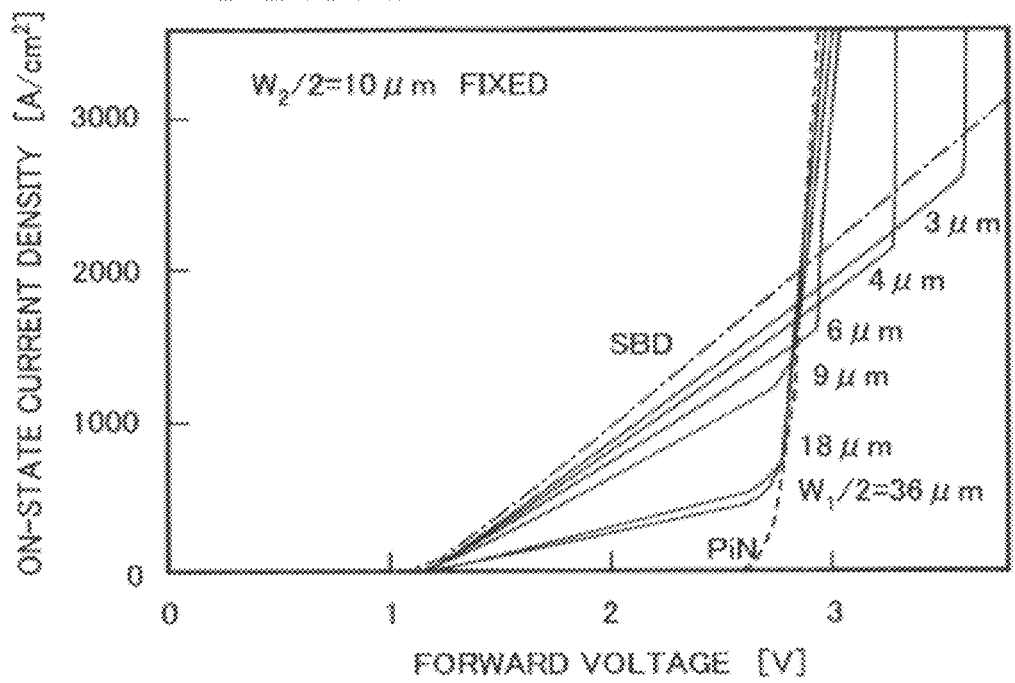
FIG. 11 is a view illustrating a simulation result of dependence of the on-state current density on a p+ type impurity region width in the first embodiment.

FIG. 11 is a view illustrating a simulation result of dependence of the on-state current density on a p+ type impurity region width in the semiconductor rectifying device of the first embodiment. FIG. 11 illustrates the simulation result of the relationship between the forward current and the on-state current density for the MPS having the 1200-V-class breakdown voltage. FIG. 11 also illustrates characteristics of the 1200-V-class breakdown voltage SBD and PiN diode for the purpose of comparison. A measurement temperature is 150° C.

The n− type SiC layer 14 of the MPS has the thickness d of 8 μm and the impurity concentration of 6E+15 atoms/cm³. In the SiC substrate 12, the thickness is 1.0 μm and the depth of the p+ type impurity region 18 is 0.6 μm. The half width $W_2/2$ of the n type impurity region 16 is fixed to 10 μm.

The hole injection voltage at which the on-state current density of the MPS rises steeply depends on the half width $W_1/2$ of the p+ type impurity region 18, and $W_1/2=9$ μm becomes substantially equal to that of the PiN diode.

Figure 12:
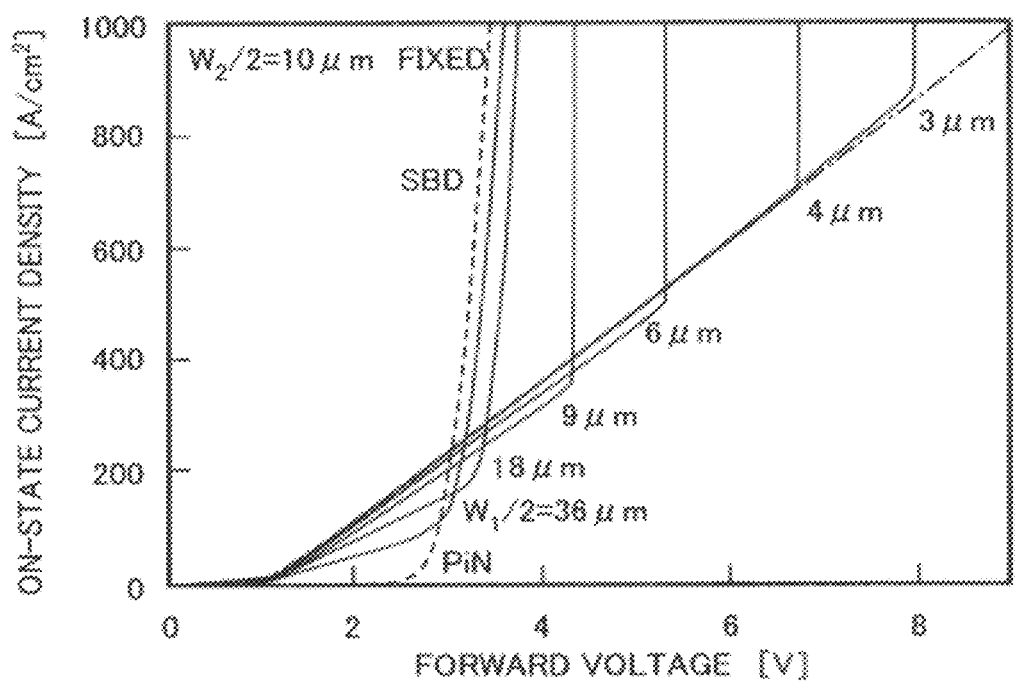
FIG. 12 is a view illustrating a simulation result of the dependence of the on-state current density on the p+ type impurity region width for the semiconductor rectifying device of the first embodiment.

FIG. 12 is a view illustrating a simulation result of the dependence of the on-state current density on the p+ type impurity region width for the semiconductor rectifying device of the first embodiment. FIG. 12 illustrates the simulation result of the relationship between the forward current and the on-state current density for the MPS having the 3300-V-class breakdown voltage. FIG. 11 also illustrates characteristics of the 3300-V-class breakdown voltage SBD and PiN diode for the purpose of comparison. The measurement temperature is 150° C.

The n− type SiC layer 14 of the MPS has the thickness d of 25 μm and the impurity concentration of 4E+15 atoms/cm³. In the SiC substrate 12, the thickness is 1.0 μm and the depth of the p+ type impurity region 18 is 0.6 μm. The half width $W_2/2$ of the n type impurity region 16 is fixed to 10 μm.

The hole injection voltage at which the on-state current density of the MPS rises steeply depends on the half width $W_1/2$ of the p+ type impurity region 18, and $W_1/2=36$ μm becomes substantially equal to that of the PiN diode.

Figure 13:
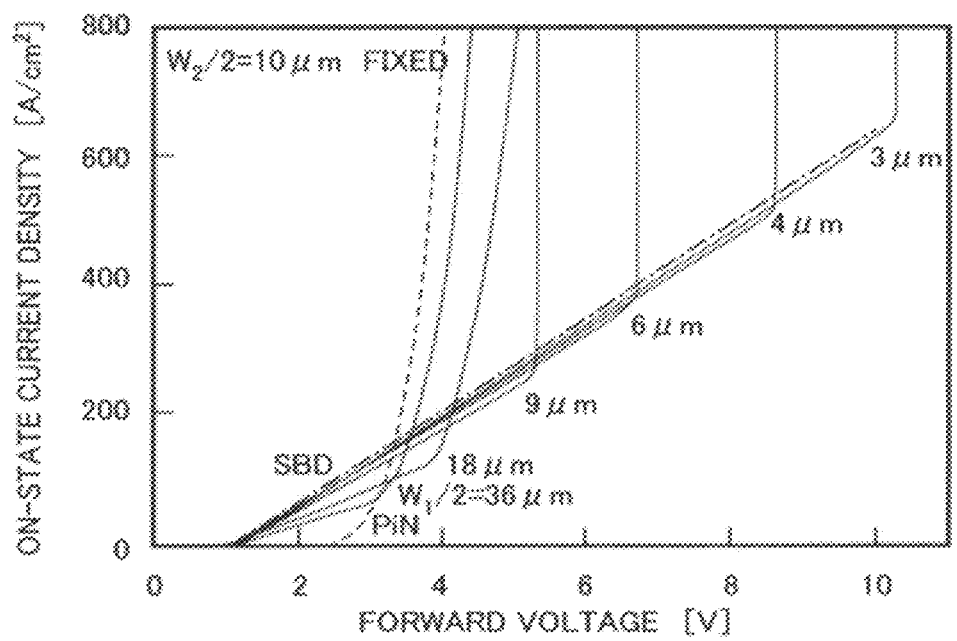
FIG. 13 is a view illustrating a simulation result of the dependence of the on-state current density on the p+ type impurity region width for the semiconductor rectifying device of the first embodiment.

FIG. 13 is a view illustrating a simulation result of the dependence of the on-state current density on the p+ type impurity region width for the semiconductor rectifying device of the first embodiment. FIG. 13 illustrates the simulation result of the relationship between the forward current and the on-state current density for the MPS having the 4500-V-class breakdown voltage. FIG. 11 also illustrates characteristics of the 3300-V-class breakdown voltage SBD and PiN diode for the purpose of comparison. The measurement temperature is 150° C.

The n– type SiC layer 14 of the MPS has the thickness d of 35 μm and the impurity concentration of 3E+15 atoms/cm³. In the SiC substrate 12, the thickness is 1.0 μm and the depth of the p+ type impurity region 18 is 0.6 μm. The half width $W_2/2$ of the n type impurity region 16 is fixed to 10 μm.

The hole injection voltage at which the on-state current density of the MPS rises steeply depends on the half width $W_1/2$ of the p+ type impurity region 18, and $W_1/2=36$ μm becomes substantially equal to that of the PiN diode.

Thus, as is clear from the simulation, in the high-breakdown-voltage MPS of the 3300-V class or more, the hole injection voltage becomes substantially equal to that of the PiN diode when the half width of the p+ type impurity region is widen to about 36 μm (total width of 72 μm).

Figure 14:
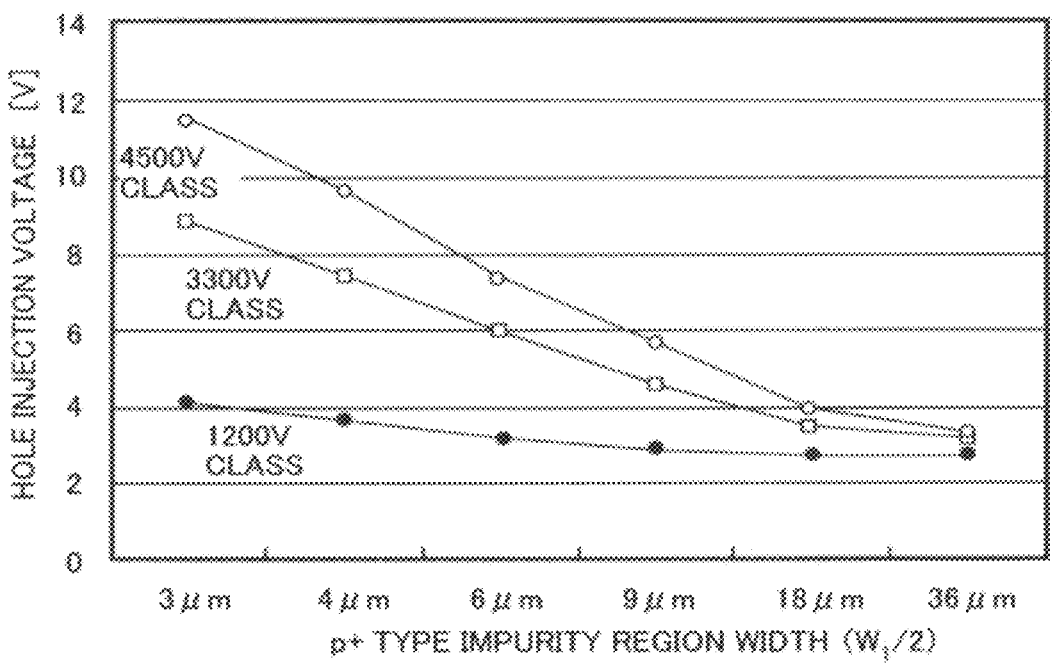
FIG. 14 is a view illustrating a relationship between the p+ type impurity region width and a hole injection voltage in the semiconductor rectifying device of the first embodiment.

FIG. 14 is a view illustrating a relationship between the p+ type impurity region width and a hole injection voltage in the semiconductor rectifying device of the first embodiment. FIG. 14 is a view illustrating a summary of the results of FIG. 11 to FIG. 13.

When compared with the low-voltage MPS of the 1200-V class, in the high-breakdown-voltage MPS of the 3300-V class and 4500-V class, the hole injection voltage largely depends on the p+ type impurity region width. In the high-breakdown-voltage MPS, the dependence is saturated when the half width of the p+ type impurity region becomes about 18 μm (total width of 36 μm).

Figure 15A:
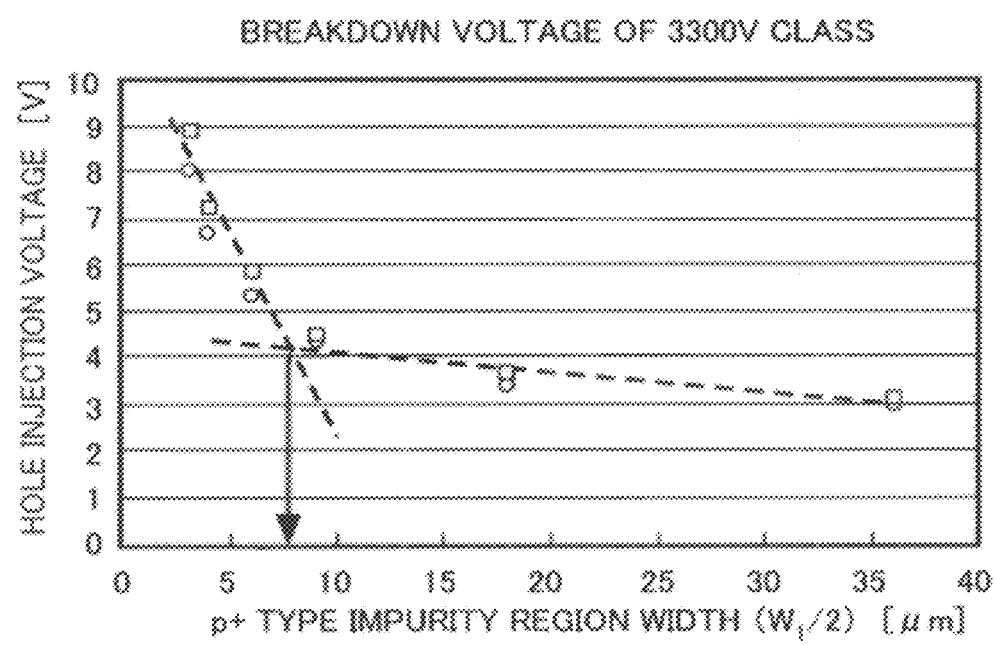
FIG. 15A and FIG. 15B are views illustrating the relationship between the p+ type impurity region width and the hole injection voltage in the semiconductor rectifying device of the first embodiment.
Figure 15B:
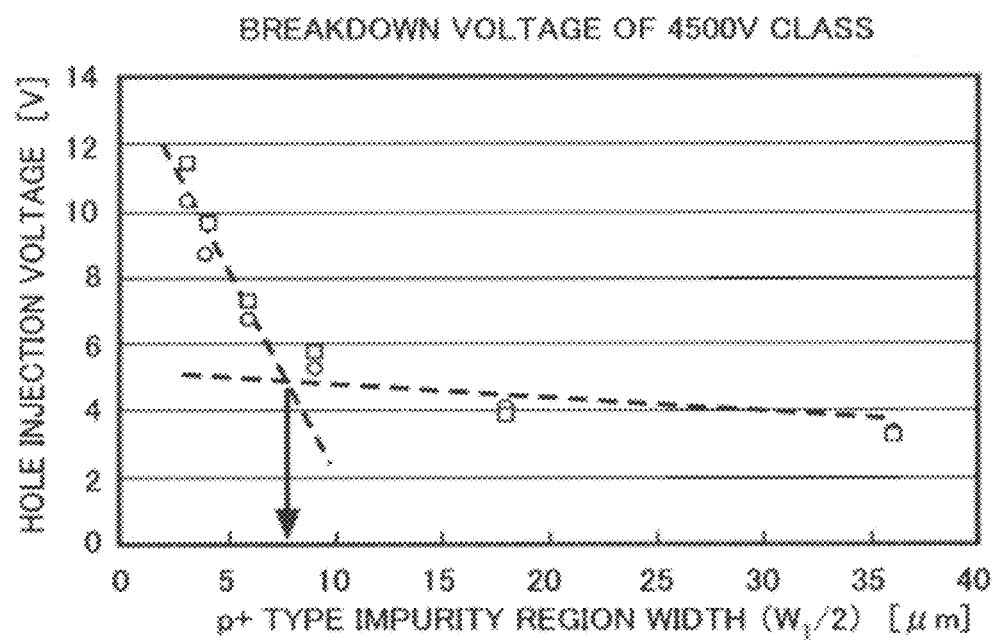

FIG. 15 is a view illustrating the relationship between the p+ type impurity region width and the hole injection voltage in the semiconductor rectifying device of the first embodiment. FIG. 15A illustrates the 3300-V-class MPS, and FIG. 15B illustrates the 4500-V-class MPS.

In FIG. 15, the result at the measurement temperature of 25° C. is added to the results of FIG. 11 to FIG. 13. A white square indicates the result at 25° C. and a white circle indicates the result at 150° C. In a horizontal axis of FIG. 15, the result is plotted on linear scale, and a fitting line is expressed by a dotted line.

As is clear from FIG. 15, for both the 3300-V class and the 4500-V class, the hole injection voltage does not depend on the temperature, and the dependence of the hole injection voltage on the p+ type impurity region width is relaxed near the half width of 7.5 μm (total width of 15 μm) of the p+ type impurity region. The dependence is saturated when the half width of the p+ type impurity region becomes 18 μm (total width of 36 μm) or more.

Accordingly, in the high-breakdown-voltage MPS of the 3300-V class or more, from the viewpoint that the destruction ratio of the element is reduced when the forward surge current is generated and the viewpoint that a variation in destruction ratio of the element is suppressed, it is necessary that the total width of the p+ type impurity region be not lower than 15 μm, and it is desirable that the total width of the p+ type impurity region be not lower than 36 μm.

Figure 16:
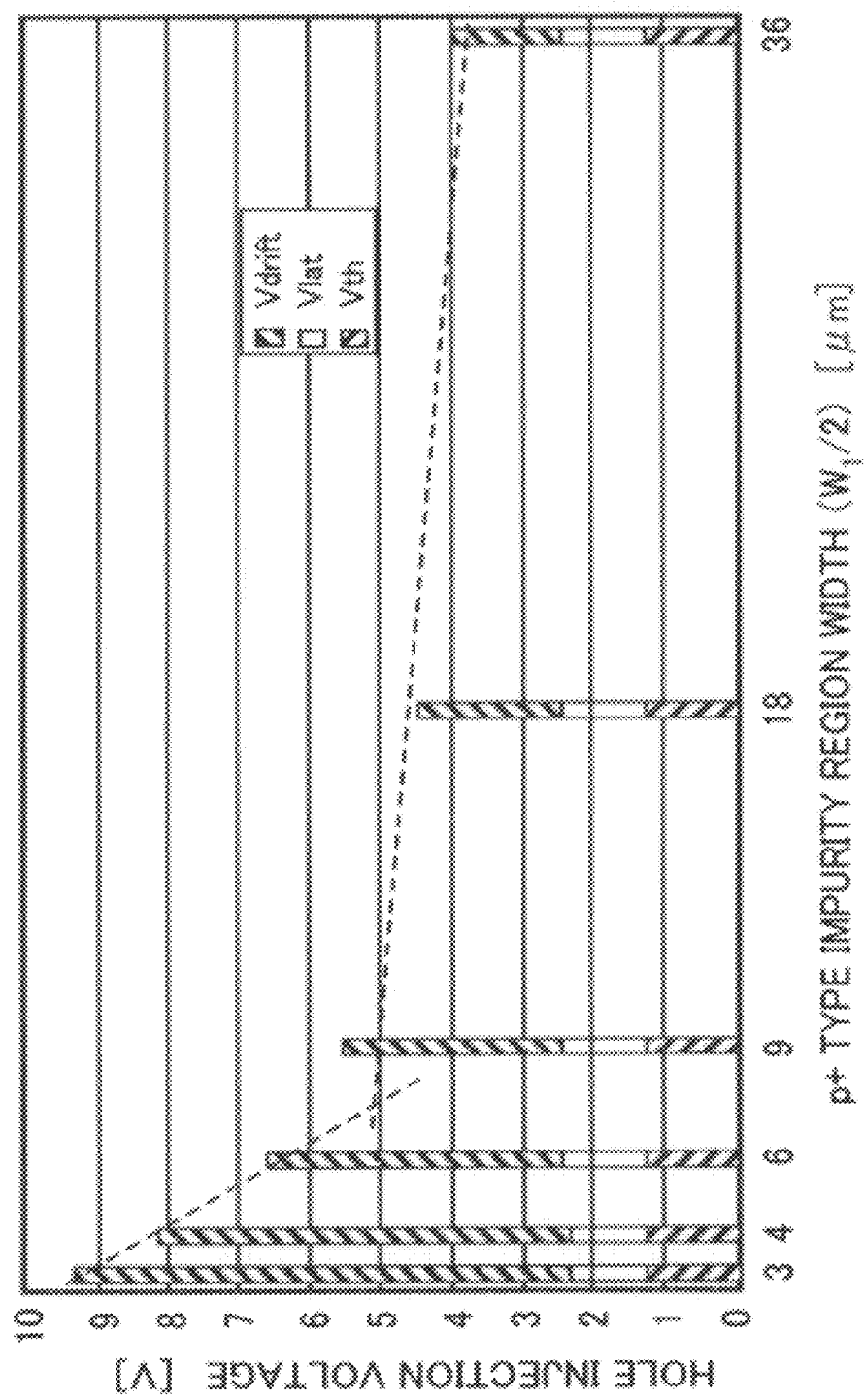
FIG. 16 is a view illustrating a relationship between the p+ type impurity region width and each component of the hole injection voltage in the semiconductor rectifying device of the first embodiment.

FIG. 16 is a view illustrating a relationship between the p+ type impurity region width and each component of the hole injection voltage in the semiconductor rectifying device of the first embodiment. FIG. 16 illustrates the hole injection voltage while components of the hole injection voltage are divided into a rise voltage $V_{th}$ of the Schottky diode, the voltage drop $V_{lat}$ from the end portion of the p+ type impurity region to the center portion in the width direction of the bottom surface of the p+ type impurity region, and the voltage drop $V_{drift}$ from the lower surface of the SiC substrate to the bottom surface of the p+ type impurity region. Each component is determined from a potential distribution immediately before the hole injection, more specifically, the potential distribution that is obtained when the hole injection concentration becomes 1E14 atoms/cm³ in the center portion in the width direction of the bottom surface of the p+ type impurity region.

The main reason the hole injection voltage is increased in the high-breakdown-voltage MPS of the 3300-V class or more is that the voltage drop caused by the drift layer that becomes thickened and diluted is increased. As described above, the dependence of the hole injection voltage on the p+ type impurity region width is relaxed near the half width of 7.5 μm (total width of 15 μm) of the p+ type impurity region. At this point, a relationship of $V_{lat}=0.3\times V_{drift}$ holds.

As described above, the dependence is substantially saturated when the half width of the p+ type impurity region is 18 μm (total width of 36 μm) or more. At this point, a relationship of $V_{lat}=0.89\times V_{drift}$ holds.

Accordingly, in the high-breakdown-voltage MPS of the 3300-V class or more, from the viewpoint that the destruction ratio of the element is reduced when the forward surge current is generated and the viewpoint that a variation in destruction ratio of the element is suppressed, it is necessary that the relationship of $V_{lat} \geq 0.3 \times V_{drift}$ be satisfied, and it is desirable that the relationship of $V_{lat} \geq 0.89 \times V_{drift}$ be satisfied.

Whether the relationship is satisfied can be confirmed by performing the simulation of the potential distribution, when the structure of the semiconductor rectifying device is fixed.

Figure 17:
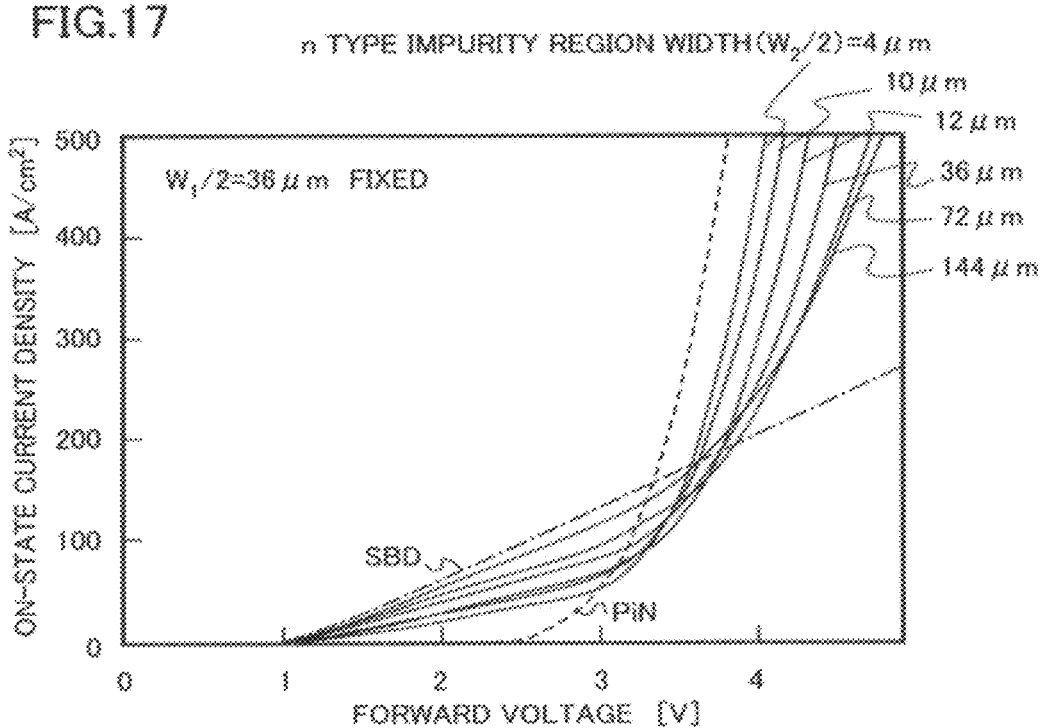
FIG. 17 is a view illustrating a simulation result of dependence of the on-state current density on an n type impurity region width for the semiconductor rectifying device of the first embodiment.

FIG. 17 is a view illustrating a simulation result of the dependence of the on-state current density on the n type impurity region width for the semiconductor rectifying device of the first embodiment. FIG. 17 illustrates the simulation result of the 3300-V-class MPS at 150° C. The half width $W_1/2$ of the p+ type impurity region is fixed to 36 μm.

In the neighborhood of the practical usage voltage of 2 to 3 V of the MPS, the on-state current density comes close to that of SBD when the n type impurity region width is increased, and at least a half of the on-state current density of the SBD can be secured when the n type impurity region width becomes 36 μm (total width of 72 μm) that is substantially equal to the p+ type impurity region width, and the on-state current becomes substantially equal to that of the SBD when the n type impurity region is not lower than 144 μm (total width of 288 μm). Accordingly, from the viewpoint that the on-state current density is secured, desirably the p+ type impurity region is not lower than 72 μm, more desirably 288 μm.

In the first embodiment, in order that the semiconductor rectifying device is operated as the MPS, and in order that the surge current is effectively passed between the p+ type impurity region and the n type impurity region, desirably the first electrode 24 is Schottky-connected to the n type impurity region 16 while the first electrode 24 is ohmic-contact to the p+ type impurity region 18.

Figure 18:
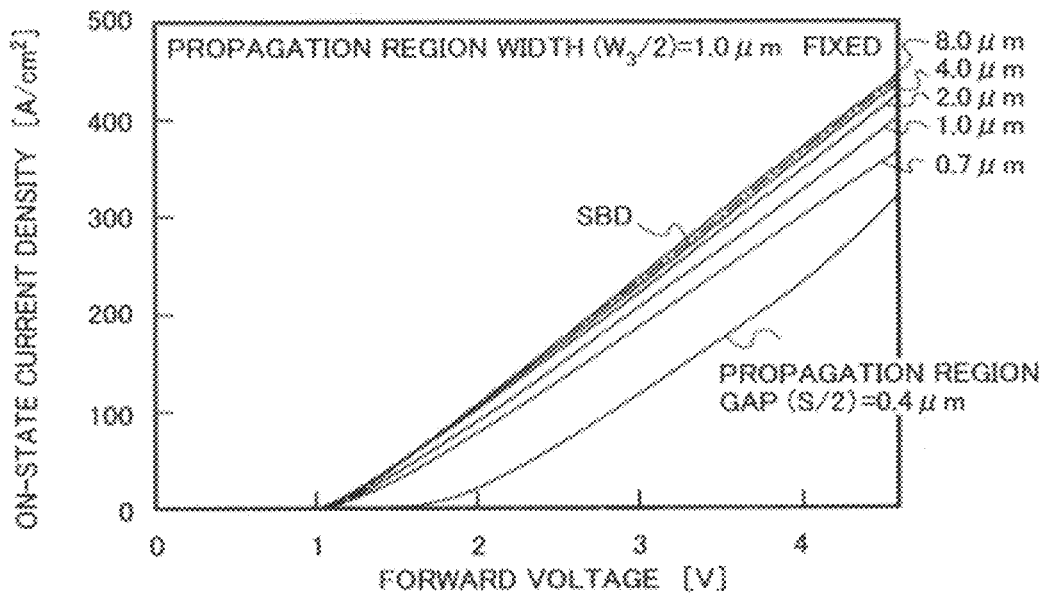
FIG. 18 is a view illustrating a simulation result of dependence of the on-state current density on a propagation region gap for the semiconductor rectifying device of the first embodiment.

FIG. 18 is a view illustrating a simulation result of the dependence of the on-state current density on the propagation region gap for the MPS 100 of the first embodiment. The simulation is performed in the simplified structure only including the propagation region and the n type impurity region. A half width ($W_3/2$) of the propagation region 32 is fixed to 1.0 μm. A half (S/2, see FIG. 1) of the propagation region gap is set to a variable. The SBD in which the propagation region does not exist is also illustrated for the purpose of comparison.

As is clear from FIG. 18, the on-state current density becomes equal to that of the SBD in which the propagation region does not exist when the half of the propagation region gap becomes 4.0 μm or more. Accordingly, from the viewpoint that the on-state current density is secured, desirably the propagation region gap is not lower than 8.0 μm.

Desirably the propagation region has the width of 0.5 μm or more. This is because the stable impurity region is hardly formed when the propagation region width is lower than 0.5 μm.

In the first embodiment, both the ends of the propagation region are connected to the p+ type impurity region by way of example. However, the hole propagates when the propagation region is partially connected to the p+ type impurity region. Accordingly, for example, one end of the propagation region may be connected to the p+ type impurity region.

As described above, according to the semiconductor rectifying device of the first embodiment, the hole injection can be dispersed in the wide range of the activation region of the element. Therefore, the heat generation region of the element can be dispersed to further reduce the percent defective caused by the forward surge current. The region where the hole is generated is controlled by restricting the longitudinal direction of the hole propagation region and the propagation region gap which allows the suppression of the generation of the stacking fault (SF) caused by the basal plain dislocation (BPD). Therefore, the degradation of the forward characteristic can be suppressed to implement the semiconductor rectifying device having the improved reliability.

Particularly, the large current can be passed at the low forward voltage by restricting the impurity concentration and thickness of the first-conductive-type wide bandgap semiconductor layer and the second wide bandgap semiconductor region width, which allows the suppression of the heat generation energy and the decrease in destruction ratio of the element. Accordingly, the first embodiment of the invention can provide the high-breakdown-voltage semiconductor rectifying device in which the wide bandgap semiconductor having the sufficient surge current resistance characteristic is used.

Additionally, according to the first embodiment, the diode can be operated at a high frequency. When a forward bias is applied to pass the forward current, the hole injection is generated to accumulate the hole in the drift layer. Then, in the operation in which the breakdown voltage is stretched out by applying a reverse bias to widen a depletion layer in the drift layer, it is necessary that the hole accumulated during a forward bias be ejected from the drift layer. At this point, a hole ejection port becomes the anode electrode through the p+ type impurity region, and the effective hole ejection port is enlarged because of the existence of the propagation region sandwiched between the n type impurity regions. Accordingly, the hole can easily be ejected to performed the diode operation at the high frequency. Conventionally, in a mode in which the PiN diode is used as a low current, when the reverse bias is switched to the forward bias, the hole is rapidly eliminated because of the low hole injection density, which results in a problem in that a large vibration waveform is generated. Therefore, it is necessary to consider a time for which the vibration waveform is attenuated, which becomes a drag against speed enhancement of an inverter or the like. On the other hand, in the first embodiment, the semiconductor rectifying device is operated in a bipolar mode in which the hole injection is generated at the high current density, and the semiconductor rectifying device can be operated in a unipolar mode by the electron current at the low current density. Accordingly, the vibration that becomes troublesome in the conventional PiN diode can be suppressed in the low current density operation to operate the high-breakdown-voltage semiconductor rectifying device at high speed.

Figure 28A:
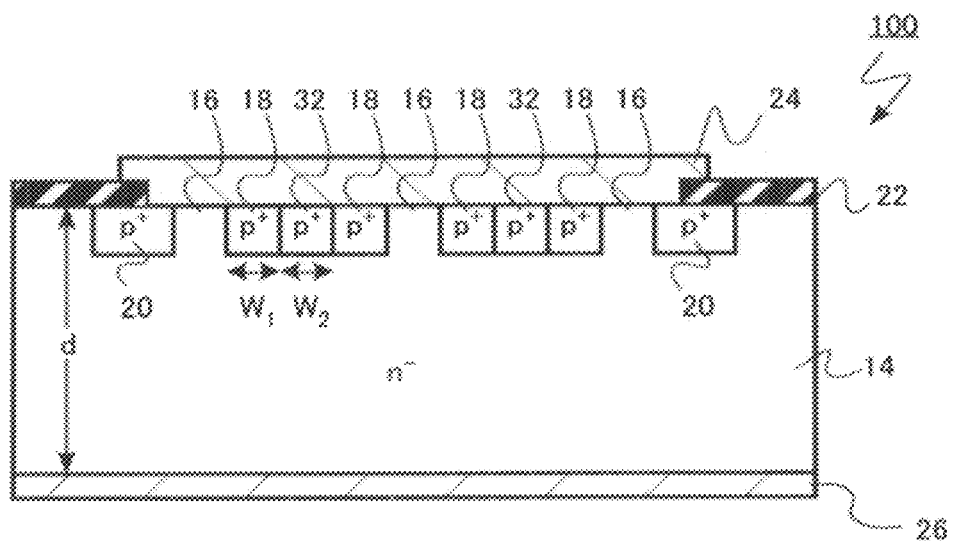
FIG. 28A and FIG. 28B are sectional views of the semiconductor rectifying device according to a modification of the first embodiment.
Figure 28B:
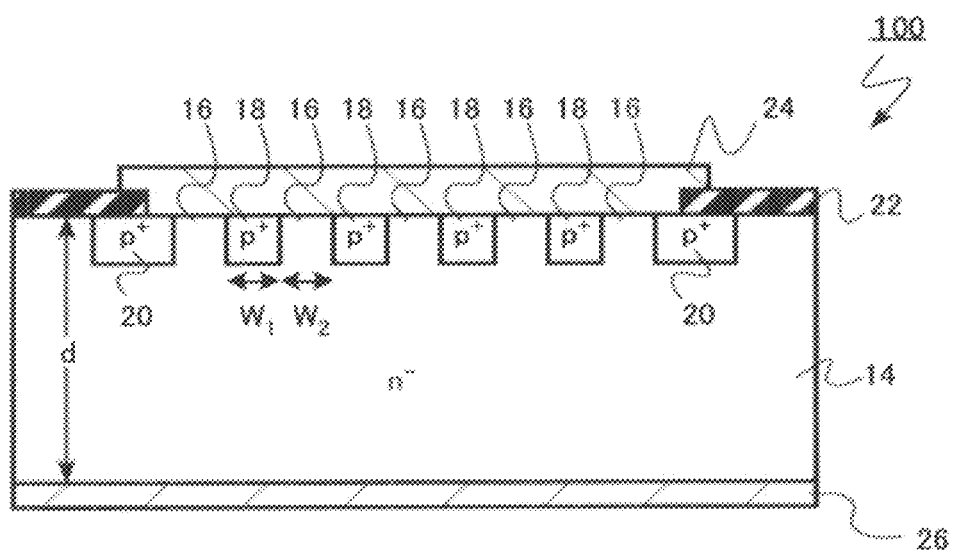

FIG. 28A and FIG. 28B are sectional views of the semiconductor rectifying device according to a modification of the first embodiment. Other than the second electrode (cathode electrode) 26 being formed in the lower surface of the n− type SiC layer 14 are same as the first embodiment shown in FIG. 2A and FIG. 2B. By eliminating the n+ type 4H—SiC substrate, lower resistance of the device can be realized compared to the first embodiment. The semiconductor rectifying device of this modification may be manufactured by polishing away the n+ type 4H—SiC substrate before the formation of the second electrode (cathode electrode) 26.

Second Embodiment

A semiconductor memory device according to a second embodiment differs from the semiconductor rectifying device of the first embodiment in that the first electrode 24 includes an ohmic electrode 24a and a Schottky electrode 24b, which are made of different materials. Therefore, the descriptions of the contents overlapped with those of the first embodiment are omitted.

Figure 19:
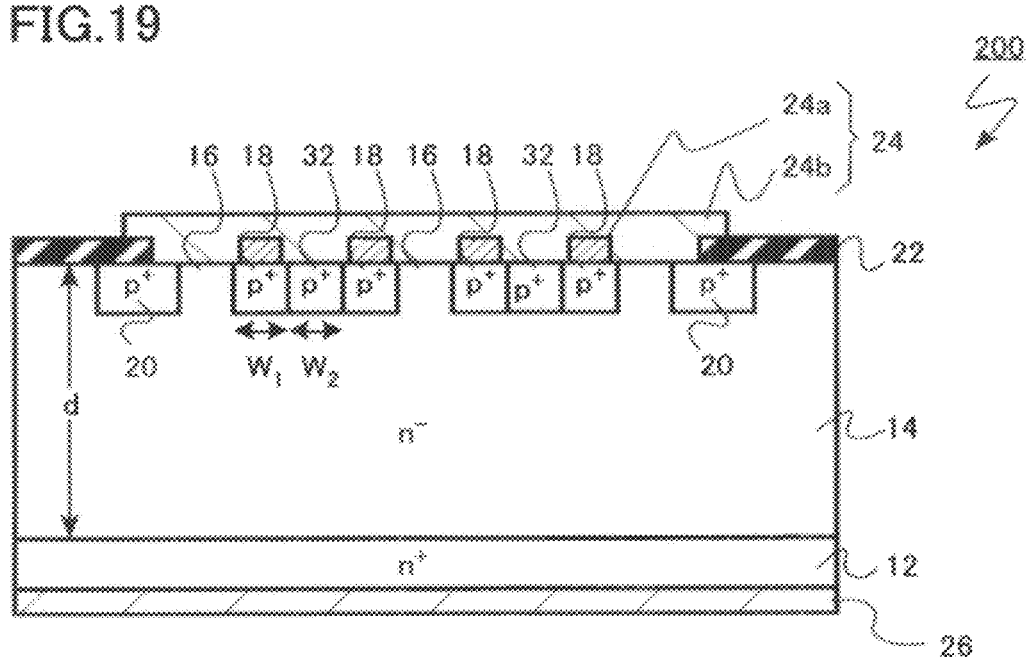
FIG. 19 is a sectional view of a semiconductor rectifying device according to a second embodiment.

FIG. 19 is a sectional view of an MPS that is the semiconductor rectifying device of the second embodiment. In an MPS 200, the ohmic electrode 24a is in contact with part of the p+ type impurity region 18 and ohmic-connected to the p+ type impurity region 18. For example, the ohmic electrode 24a is made of Ti/Al. The Schottky-electrode 24b is in contact with the n type impurity region 16 and Schottky-connected to the n type impurity region 16. For example, the Schottky-electrode 24b is made of Ni.

Thus, when the first electrode 24 includes the two electrodes, the ohmic characteristic of the first electrode can be improved with respect to the p+ type impurity region 18 to provide the high-breakdown-voltage semiconductor rectifying device in which the characteristic is further improved.

The semiconductor rectifying device illustrated in FIG. 19 can be produced as follows. In the process corresponding to the formation of the first electrode 24d in the producing method of the first embodiment, for example, Ti/Al is deposited by the sputtering method, and the p+ type impurity region 18 is selectively patterned to form the ohmic electrode 24a, and Ni is deposited by the sputtering method and patterned to form the Schottky electrode 24b. Then the sinter process is performed.

In order to further improve the ohmic characteristic of the ohmic electrode 24a, desirably the p+ type impurity region 18 has the surface concentration as high as 1E+19 to 1E+21 atoms/cm$^3$. The high concentration of the surface can be achieved by locally ion-implanting the p+ type impurity in the surface of the p+ type impurity region 18.

Third Embodiment

A semiconductor rectifying device according to a third embodiment differs from the semiconductor rectifying device of the second embodiment in that the ohmic electrode 24a is also ohmic-contact to the p+ type propagation region 32. Therefore, the descriptions of the contents overlapped with those of the second embodiment are omitted.

Figure 20:
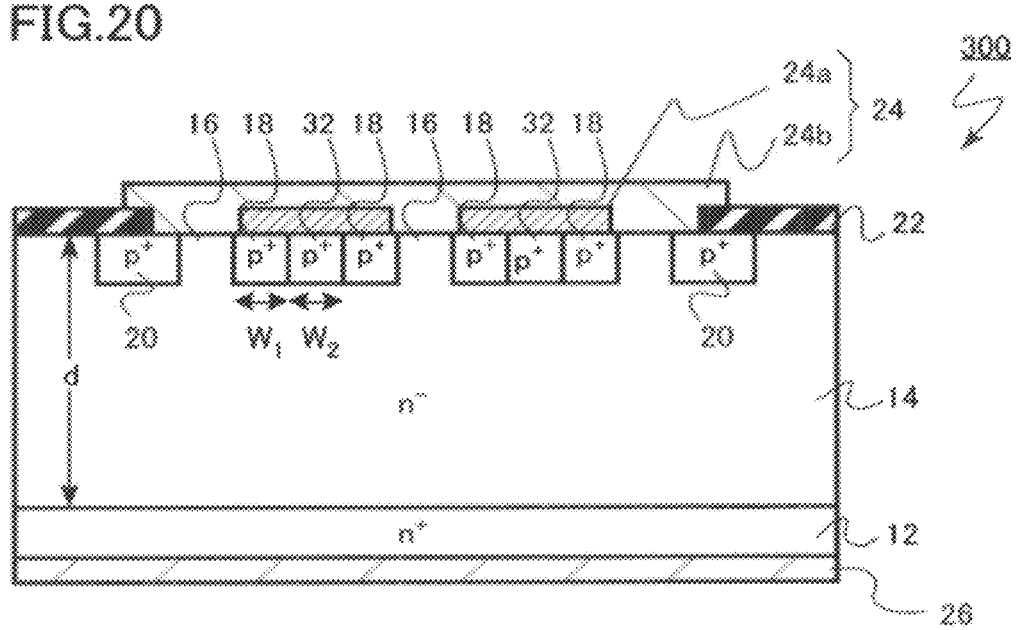
FIG. 20 is a sectional view of a semiconductor rectifying device according to a third embodiment.

FIG. 20 is a sectional view illustrating an MPS that is the semiconductor rectifying device of the third embodiment. In an MPS 300, the ohmic electrode 24a is in contact with at least part of the p+ type impurity region 18 and part of the p+ type propagation region 32 and ohmic-connected to the p+ type impurity region 18 and the p+ type propagation region 32. For example, the ohmic electrode 24a is made of Ti/Al. The Schottky-electrode 24b is in contact with the n type impurity region 16 and Schottky-connected to the n type impurity region 16. For example, the Schottky-electrode 24b is made of Ni.

According to the third embodiment, the propagation region 32 is also ohmic-contact to the first electrode, so that the surge current can further effectively be passed between the p+ type impurity region and the n type impurity region.

Fourth Embodiment

A semiconductor rectifying device according to a fourth embodiment differs from the semiconductor rectifying device of the first embodiment in that the pattern of the p+ type impurity region. Therefore, the descriptions of the contents overlapped with those of the first embodiment are omitted.

Figure 21:
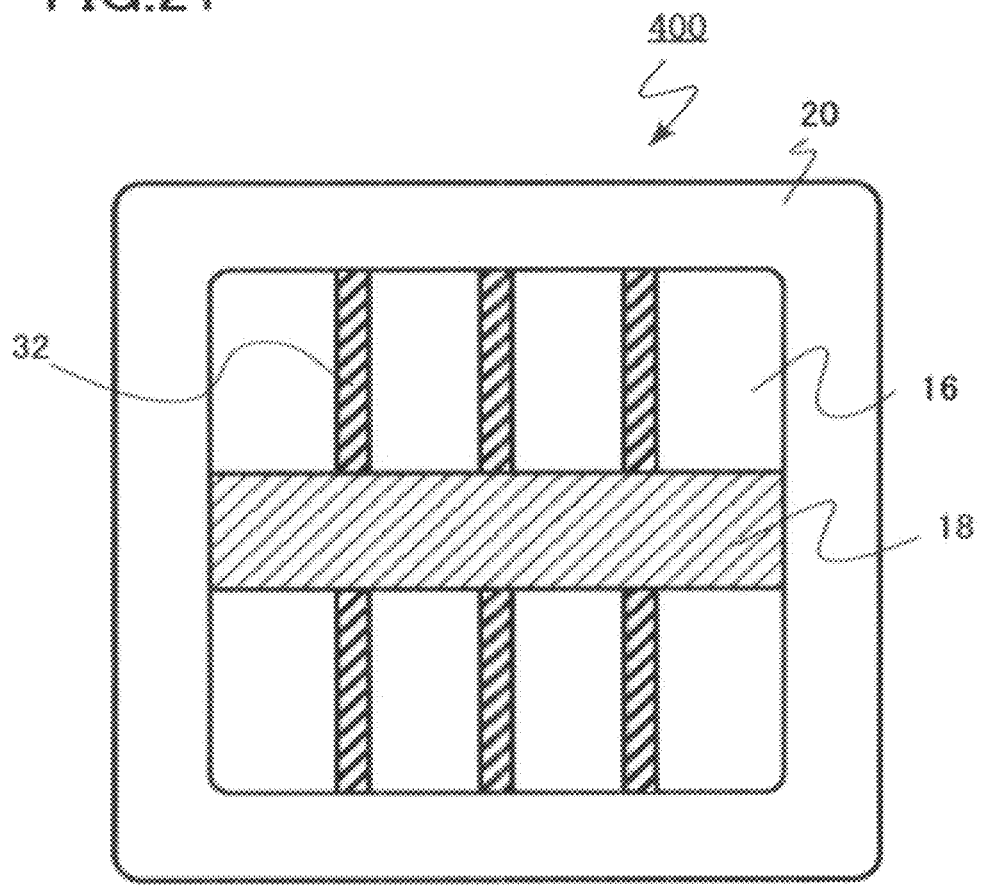
FIG. 21 is a plan view of a semiconductor rectifying device according to a fourth embodiment.

FIG. 21 is a plan view illustrating an MPS that is the semiconductor rectifying device of the fourth embodiment. In an MPS 400, one p+ type impurity region 18 is formed while connected to the RESURF region 20. A plurality of p+ type propagation regions 32 are formed, and one end of each of the p+ type propagation regions is connected to the p+ type impurity region 18 while the other end is connected to the RESURF region 20.

The effect similar to that of the first embodiment is realized in the fourth embodiment.

Figure 22:
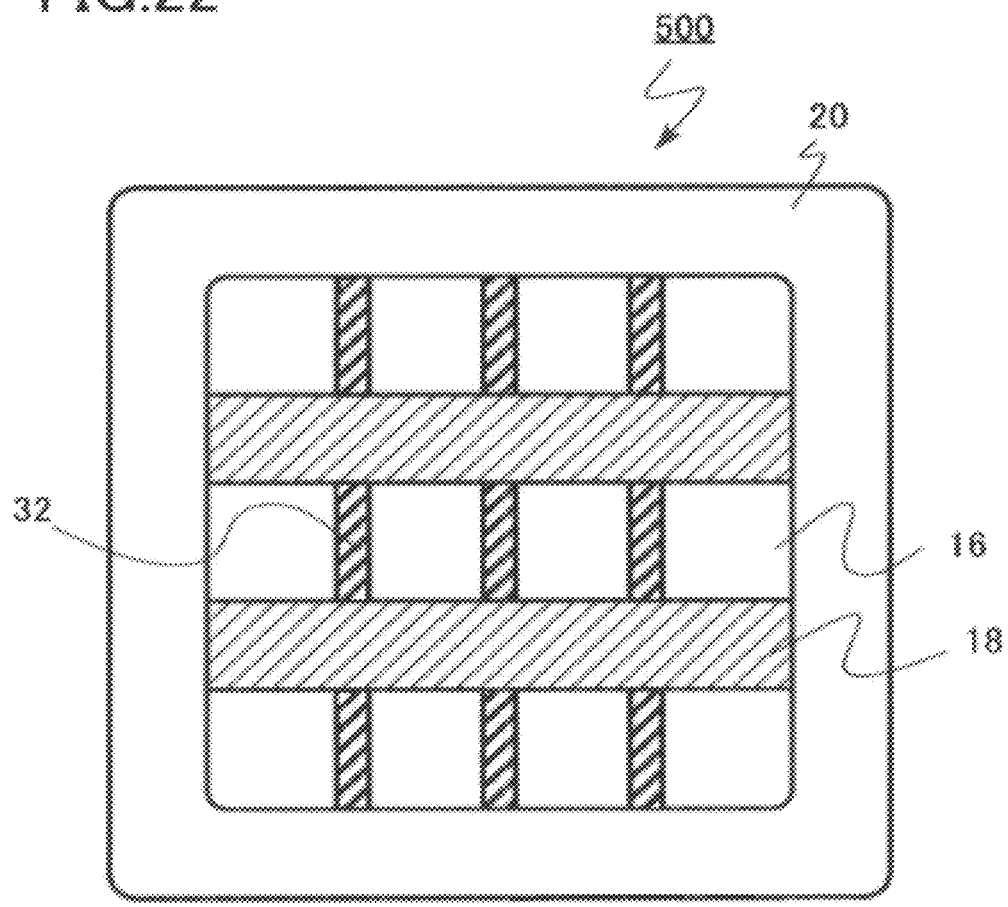
FIG. 22 is a plan view of a semiconductor rectifying device according to a modification of the fourth embodiment.

FIG. 22 is a plan view illustrating an MPS that is a semiconductor rectifying device according to a modification of the fourth embodiment. As illustrated in FIG. 22, in an MPS 500, the effect similar to that of the first embodiment is realized even if at least the two p+ type impurity regions 18 are provided.

The first to fourth embodiments of the invention are specifically described above. The embodiments are described only by way of example, but the invention is not limited to the embodiments. In the embodiments, the description of the portion that is not directly necessary for the description of the invention is omitted in the semiconductor rectifying device and the semiconductor rectifying device producing method. The constituents necessary for the semiconductor rectifying device and the semiconductor rectifying device producing method can appropriately be selected and used.

For example, in the embodiments, the first conductive type is the n type and the second conductive type is the p type by way of example. Alternatively, a semiconductor rectifying device in which the first conductive type is the p type and the second conductive type is the n type may be used.

In the embodiments, the two square p+ type impurity regions are formed by way of example. The p+ type impurity region may be formed into other shapes, such as a stripe shape, a lattice shape, a dot shape, a rectangle, a hexagon, a polygon, and a ring shape, which have the desired width. The number of p+ type impurity regions may be one or at least three. However, desirably at least a plurality of p+ type impurity regions are provided from the viewpoint that the heat generation region is dispersed.

In the embodiments, the silicon carbide is used as the wide bandgap semiconductor by way of example. Alternatively, the invention may be applied to other wide bandgap semiconductors such as gallium nitride (GaN).

In the embodiments, the first electrode is made of Ni or Ti/Al by way of example. Alternatively, other materials such as Mo, W, Pt, Ta, and TaN or an alloy, silicide, and carbide thereof can be used in order to obtain the Schottky barrier height ($\phi B$) and contact resistance, which are required as the MPS.

All the semiconductor rectifying devices, which include the constituents of the invention and in which the design can appropriately be changed by those skilled in the art, are included in the scope of the invention. The scope of the invention is defined by claims of the invention and the range equivalent thereto.

Fifth Embodiment

A semiconductor rectifying device according a fifth embodiment includes a hexagonal first-conductive-type wide bandgap semiconductor substrate; a hexagonal first-conductive-type wide bandgap semiconductor layer that is formed on an upper surface of the wide bandgap semiconductor substrate, the wide bandgap semiconductor layer having an impurity concentration lower than that of the wide bandgap semiconductor substrate; a first-conductive-type first wide bandgap semiconductor region that is formed in a surface of the wide bandgap semiconductor; a plurality of second-conductive-type second wide bandgap semiconductor regions that are surrounded by the first wide bandgap semiconductor regions and formed, the second wide bandgap semiconductor region having a circular surface shape, the second wide bandgap semiconductor regions being regularly arrayed; a plurality of second-conductive-type third wide bandgap semiconductor regions in which both ends are connected to the adjacent second wide bandgap semiconductor regions, the third wide bandgap semiconductor region being formed while sandwiched between the first wide bandgap semiconductor regions, the third wide bandgap semiconductor region having a width smaller than that of the second wide bandgap semiconductor region; a second-conductive-type fourth wide bandgap semiconductor regions that are surrounded by the second wide bandgap semiconductor region and the third wide bandgap semiconductor region, the fourth wide bandgap semiconductor region being formed while sandwiched between the second wide bandgap semiconductor region and the third wide bandgap semiconductor region and the first wide bandgap semiconductor region; a first electrode that is formed on the first and second wide bandgap semiconductor regions; and a second electrode that is formed on a lower surface of the wide bandgap semiconductor substrate.

According to the semiconductor rectifying device of the fifth embodiment having the above-described configuration, the third wide bandgap semiconductor region acts as the propagation region of the hole generated in the second wide bandgap semiconductor region. Accordingly, the hole injection can be dispersed in the wide range of an element activation region. Therefore, the heat generation region of the element can be dispersed to decrease the percent defective caused by the forward surge current. Additionally, the minority carriers generated in the second and third wide bandgap semiconductor regions during a forward bias can be ejected in a short time during the turn-off by providing the fourth wide bandgap semiconductor region. Accordingly, the semiconductor rectifying device having the excellent turn-off characteristic is implemented. The dead space can be eliminated with respect to the forward current by forming the surface shape of the second wide bandgap semiconductor region into circular shape, thereby implementing the semiconductor rectifying device having the high on-state current.

From the viewpoint of the improvement of the turn-off characteristic, desirably the junction depth of the fourth wide bandgap semiconductor region is larger than the junction depths of the second wide bandgap semiconductor region and third wide bandgap semiconductor region.

Desirably the first-conductive-type wide bandgap semiconductor region has the impurity concentration of 1E+14 atoms/cm$^3$ to 5E+16 atoms/cm$^3$ and the thickness d of 20 μm or more, and the second wide bandgap semiconductor region has the width of 15 μm or more.

Desirably the second wide bandgap semiconductor region has the width of 36 μm or more.

Desirably the first electrode and the first wide bandgap semiconductor region are Schottky-connected, the first electrode and the second wide bandgap semiconductor region are ohmic-connected, and the first electrode and the third wide bandgap semiconductor region are ohmic-connected.

Desirably the wide bandgap semiconductor is silicon carbide, and the first conductive type is the n type.

Figure 23:
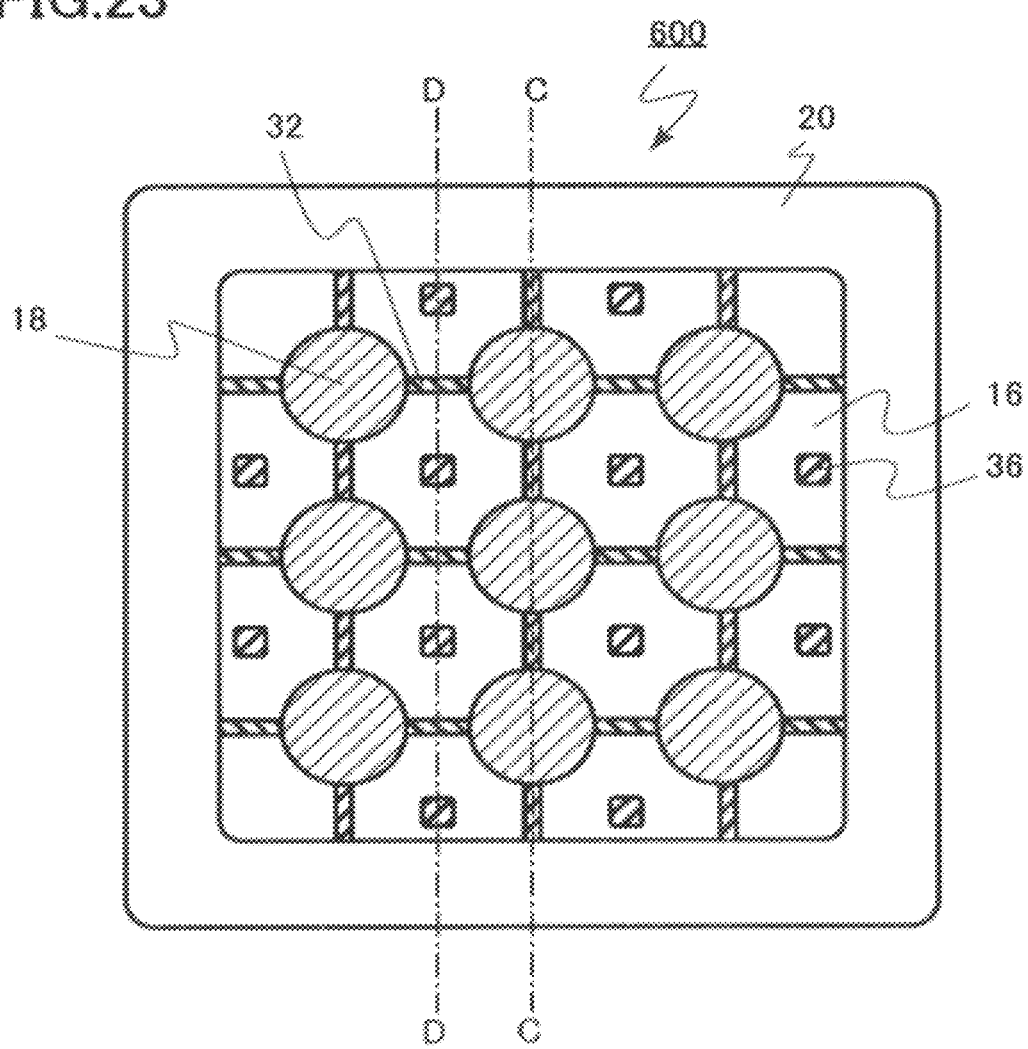
FIG. 23 is a plan view of a semiconductor rectifying device according to a fifth embodiment.

FIG. 23 and FIG. 24 are a plan view and a sectional view schematically illustrating the MPS that is the semiconductor device of the fifth embodiment. FIG. 24A is a sectional view taken on a line CC of FIG. 23, and FIG. 24B is a sectional view taken on a line DD of FIG. 23.

As illustrated in FIG. 24, in an MPS 600 of the fifth embodiment, the n– type SiC layer 14 is formed as the drift layer on the upper surface of the hexagonal n+ type 4H—SiC substrate 12. For example, the 4H—SiC substrate 12 and the n– type SiC layer 14 contain N (nitrogen) as the impurity.

The n+ type 4H—SiC substrate 12 is the low-resistance substrate having the impurity concentration of, for example, 5E+18 to 1E+19 atoms/cm$^3$. For example, the n– type SiC layer 14 has the impurity concentration of 1E+14 atoms/cm$^3$ to 5E+16 atoms/cm$^3$ and the thickness (d in FIG. 24) of 20 μm or more.

For example, the n+ type 4H—SiC substrate 12 and the n– type SiC layer 14 have the off angle of 4 to 8 degrees with respect to <11-20> of SiC.

The MPS 600 is an MPS whose required breakdown voltage ranges from 3000 V to 7000 V, that is, the so-called high-breakdown-voltage MPS of the 3000-V class to the 7000-V class. Desirably the n– type SiC layer 14 has the above-described impurity concentration and thickness in order to realize the high breakdown voltage and the sufficient on-state current density.

The n type impurity region (n type Schottky region) 16 exists in the surface of the n– type SiC layer 14. The n type impurity region 16 corresponds to the upper portion of the n– type SiC layer 14.

The p+ type impurity region 18 having the circular surface shape is formed while sandwiched between the n type impurity regions 16. In the p+ type impurity region 18, for example, Al (aluminum) or B (boron) of about 1E+18 atoms/cm$^3$ is contained as the impurity. Hereinafter the p+ type impurity region 18 is also referred to as a hole generation region.

For example, the p+ type impurity region 18 has a depth of about 0.3 to about 1.0 μm. For example, the width of the p+ type impurity region 18 or the diameter (W$_1$ in the drawings) of the circle is 15 μm or more. Desirably the p+ type impurity region 18 has a concentration as high as possible from the viewpoint that a characteristic of the junction to the first electrode is put into the ohmic characteristic or brought close to the ohmic characteristic.

When the width (W$_1$ in the drawings) of the p+ type impurity region 18 is lower than 15 μm, the hole injection voltage is insufficiently decreased to possibly degrade the resistance characteristic against the forward surge current.

The RESURF region 20 is formed on the outside of the p+ type impurity region 18. The RESURF region 20 has the impurity concentration and depth, which are substantially equal to those of the p+ type impurity region 18. The RESURF region is provided in order to stabilize the breakdown voltage of the MPS.

The surface of the n– type SiC layer 14 is coated with an insulating film 22 made of, for example, a silicon oxide film. The first electrode (anode electrode) 24 made of, for example, Ni is formed in the opening of the insulating film 22 so as to be joined to the n type impurity region 16 and the p+ type impurity region 18. The first electrode (anode electrode) 24 is formed so as to be also in contact with part of the surface of the RESURF region 20. The second electrode (cathode electrode) 26 made of, for example, Ni is formed in the lower surface of the n+ type 4H—SiC substrate 12.

When viewing from above, as illustrated in FIG. 23, the plurality of the p+ type impurity regions 18 having the widths (diameter) W$_1$ is formed in the n type impurity regions 16. The p+ type impurity regions 18 have circular surface shapes and are regularly arrayed. 9 circular p+ type impurity regions 18 are formed at vertically and horizontally equal intervals.

The RESURF region 20 is formed on the outside of the n type impurity region 16 so as to surround the n type impurity region 16. The region surrounded by the RESURF region 20 is the MPS active region.

The MPS 600 of the fifth embodiment includes a plurality of p+ type propagation regions 32. In the p+ type propagation region 32, both ends are connected to the p+ type impurity regions 18, and the width is smaller than that of the p+ type impurity region 18. The propagation region 32 is sandwiched between the n type impurity regions 16. In part of the propagation region 32, one end is connected to the p+ type impurity region 18, and the other end is connected to the RESURF region 20.

Similarly to the p+ type impurity region 18, the propagation region 32 is formed by ion implantation of Al or B. For example, the propagation region 32 has the impurity concentration of about 1E+18 atoms/cm$^3$ and the depth of about 0.3 to about 1.0 μm.

The MPS 600 includes a p+ type hole ejection region 36 having an island shape. The hole ejection region 36 is surrounded by the p+ type impurity region 18 and the p+ type propagation region 32, and is formed through the p+ type impurity region 18 and p+ type propagation region 32 and the n type impurity region 16.

Similarly to the p+ type impurity region 18 and the propagation region 32, the hole ejection region 36 is formed by the ion implantation of Al or B. For example, desirably the hole ejection region 36 has the impurity concentration of about 1E+18 atoms/cm$^3$ and the depth is larger than the depths of the p+ type impurity region 18 and propagation region 32. For example, the hole ejection region 36 has a depth of about 0.5 to about 2.0 μm.

Figure 25A:
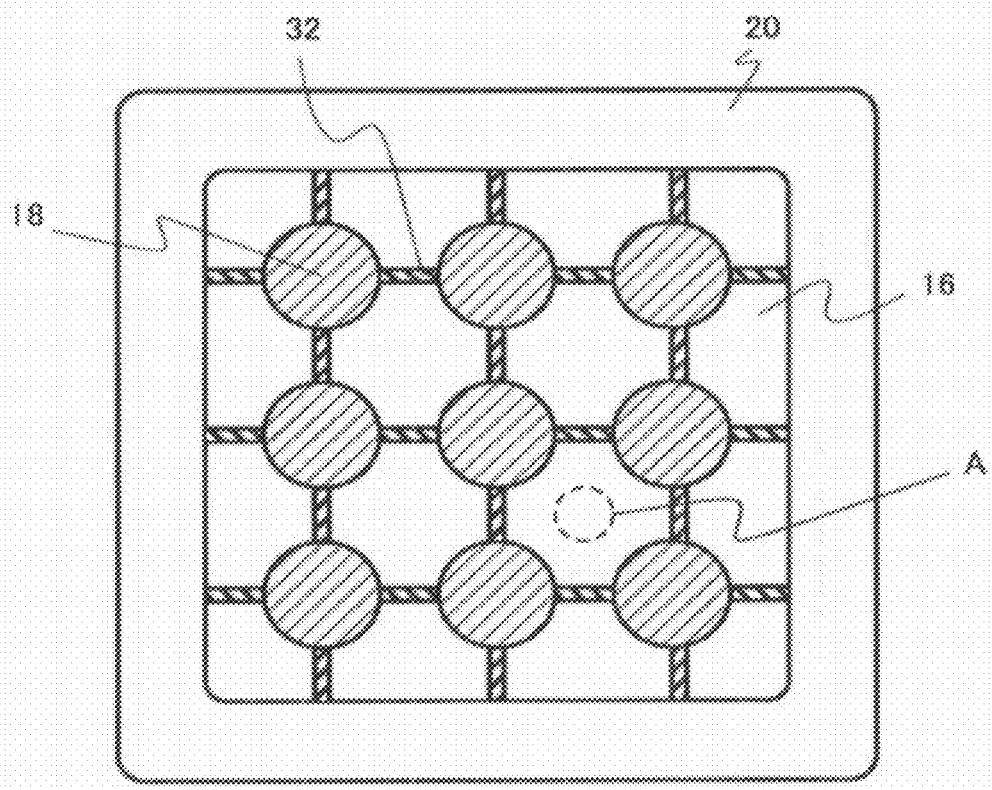
FIG. 25A and FIG. 25B are sectional views of the semiconductor rectifying device of the fifth embodiment.
Figure 25B:
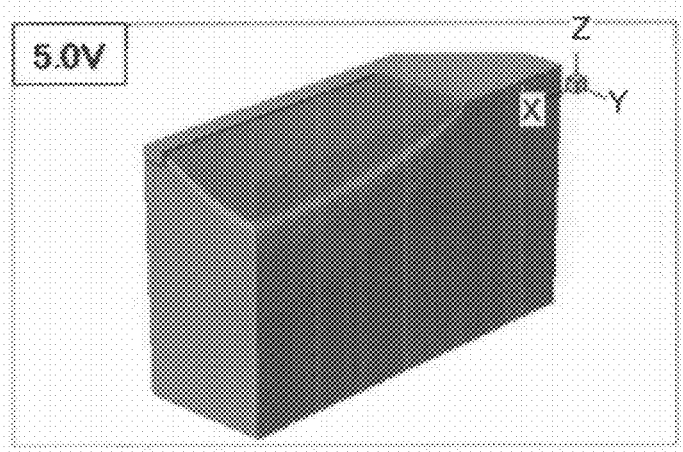

FIG. 25 is a view explaining action of the MPS of the fifth embodiment. FIG. 25A illustrates a device in which the hole ejection region 36 is removed compared with the MPS 600 of the fifth embodiment illustrated in FIG. 23. FIG. 25B illustrates a simulation result of the hole density of a region A when a forward bias of 5.0 V is applied to the MPS having the pattern of FIG. 25A.

Because the MPS 600 includes the p+ type impurity region 18, the hole injection voltage is reduced to increase the resistance characteristic against the forward surge current. From the viewpoint of the improvement of the surge current, desirably the width or the diameter (W$_1$ in FIG. 25) of the p+ type impurity region 18 is not lower than 15 μm. Desirably the p+ type impurity region 18 has the concentration as high as possible from the viewpoint that the characteristic of the junction to the first electrode is put into the ohmic characteristic or brought close to the ohmic characteristic.

In the MPS 600, the surface shape of the p+ type impurity region 18 is formed into the circular shape. Therefore, the occupied area of the p+ type impurity region 18 is reduced in the active region while the resistance characteristic against the forward surge current is retained, which allows the improvement of the on-state current. Because the resistance characteristic against the forward surge current depends on the width of the p+ type impurity region 18, when the p+ type impurity region 18 is formed into the circular shape, the effect that is substantially equal to those of the rectangular shape or stripe shape having the same width can be realized by the small occupied area of the p+ type impurity region 18.

In the MPS 600, the propagation region 32 is provided to connect the p+ type impurity regions 18, so that the heat generation region of the element can be dispersed to reduce the percent defective caused by the forward surge current.

However, in the structure of FIG. 25A, as illustrated in FIG. 25B, the high-density hole is accumulated in a region A illustrated by a broken line of FIG. 25A. Therefore, during the turn-off of the element, it take a long time to eject the hole accumulated in the region A, which results in a problem in that the turn-off characteristic of the MPS is degraded.

In the fifth embodiment, the MPS 600 includes the p+ type hole ejection region 36. The time necessary to eject the hole accumulated in the region A is shortened by providing the p+ type hole ejection region 36, thereby improving the turn-off characteristic.

Therefore, according to the fifth embodiment, the semiconductor rectifying device having the excellent resistance characteristic against surge current, the improved on-state current, and the excellent turn-off characteristic is implemented.

As described above, desirably the depth of the hole ejection region 36 is larger than the depths of the p+ type impurity region 18 and propagation region 32. As illustrated in FIGS. 7A and 7B and FIG. 25B, the high-concentration hole flows while spreading from the p type region of the anode (p+ type impurity region and propagation region) to the cathode region. At this point, for example, in the region farther away from the p type region such as the region A of FIG. 25A, the hole is accumulated in a portion lower than the lower portion of the anode in the depth direction. Therefore, ejection efficiency is degraded when the hole ejection region is provided at the same level as the p type region of the anode. Accordingly, the hole ejection region 36 is provided deeper than the p+ type impurity region 18 and the propagation region 32, which allows the improvement of the hole ejection efficiency.

Figure 26:
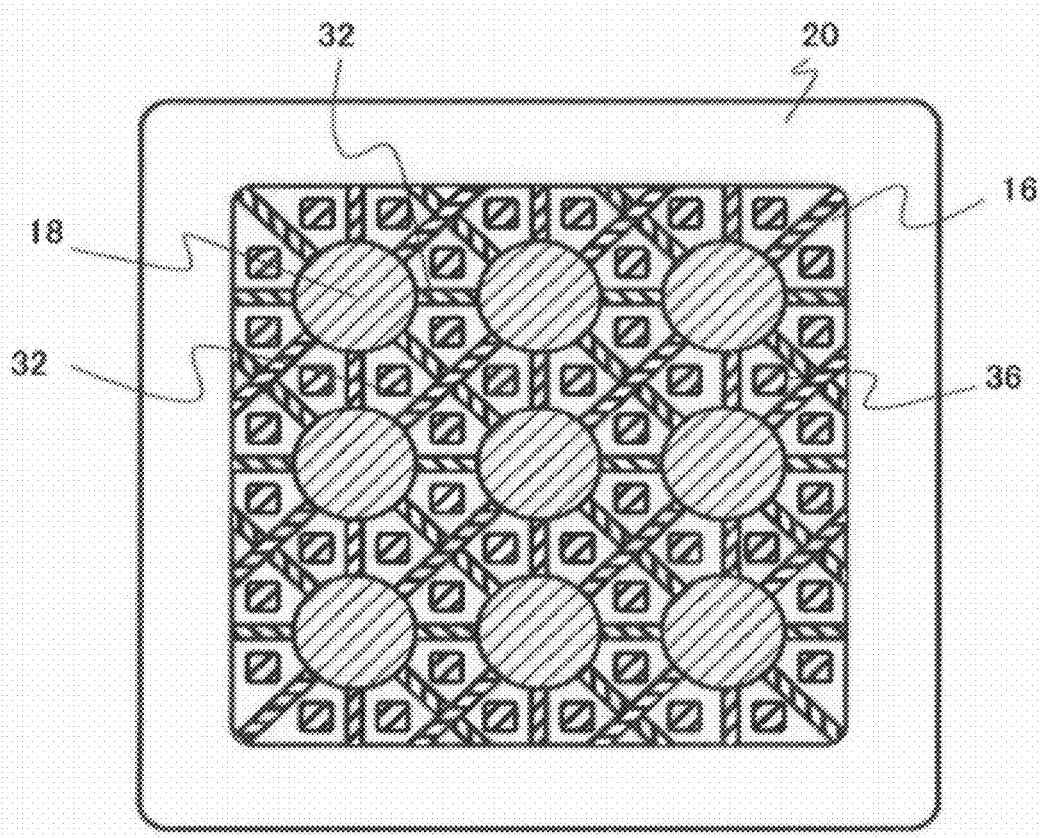
FIG. 26 is a plan view of a semiconductor rectifying device according to a first modification of the fifth embodiment.

FIG. 26 is a view illustrating a semiconductor rectifying device according to a first modification of the fifth embodiment. When compared with the MPS of FIG. 23, the propagation region 32 is further provided to obliquely connect the p+ type impurity regions 18. According to the first modification, the heat generation region of the element can further be dispersed to reduce the percent defective caused by the forward surge current.

Figure 27:
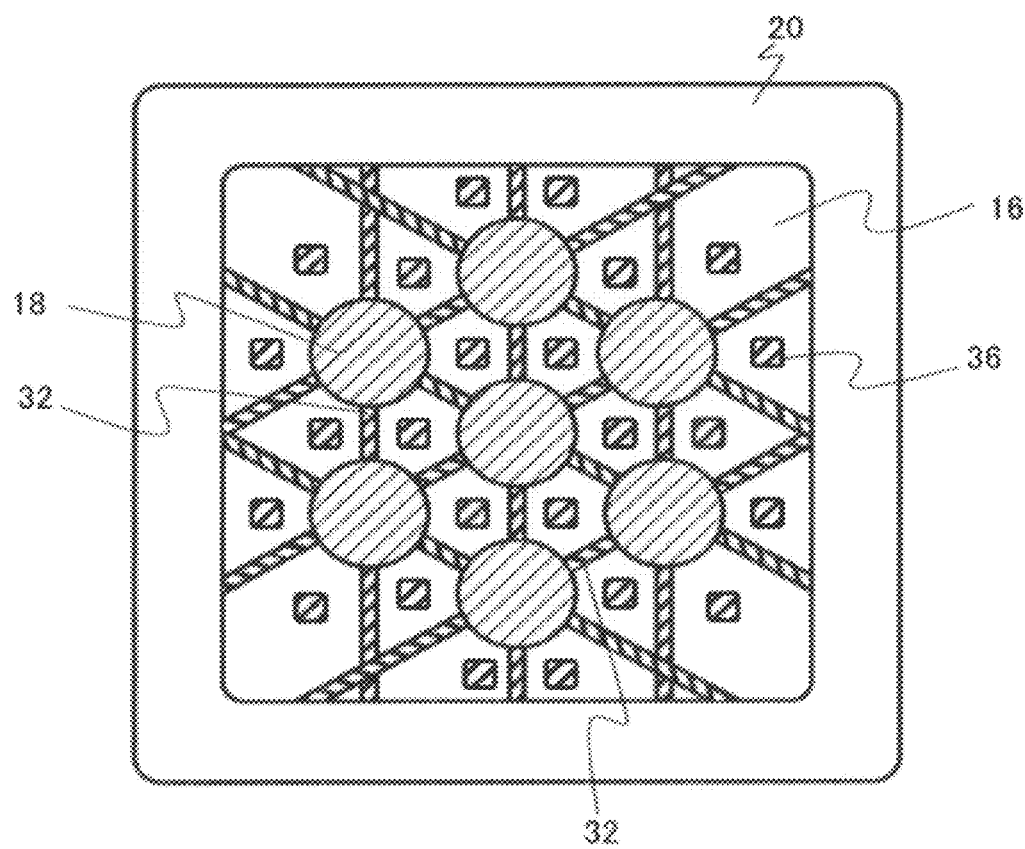
FIG. 27 is a plan view of a semiconductor rectifying device according to a second modification of the fifth embodiment.

FIG. 27 is a view illustrating a semiconductor rectifying device according to a second modification of the fifth embodiment. The array of the p+ type impurity regions 18 is changed compared with the MPS of FIG. 23. The effect similar to that of the MPS of FIG. 23 is expected in the second modification.

While certain embodiments have been described, these embodiments have been presented by way of example only, and are not intended to limit the scope of the inventions. Indeed, the semiconductor rectifying device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

In the embodiment, the semiconductor rectifying device in which the first conductive type is the n type and the second conductive type is the p type is used by way of example. Alternatively, a semiconductor rectifying device in which the first conductive type is the p type and the second conductive type is the n type may be used.

In the embodiments, the silicon carbide (SiC) is used as the wide bandgap semiconductor by way of example. Alternatively, the invention may be applied to other wide bandgap semiconductors such as gallium nitride (GaN).

What is claimed is:

1. A semiconductor rectifying device comprising:
    a semiconductor substrate made of hexagonal first-conductive-type wide bandgap semiconductor;
    a semiconductor layer made of hexagonal first-conductive-type wide bandgap semiconductor, the semiconductor layer being formed on an upper surface of the semiconductor substrate, the semiconductor layer having an impurity concentration lower than that of the semiconductor substrate;
    first semiconductor regions made of first-conductive-type wide bandgap semiconductor, the first semiconductor regions being formed at a surface of the semiconductor layer;
    second semiconductor regions made of second-conductive-type wide bandgap semiconductor, the second semiconductor regions being interposed between the first semiconductor regions;
    third semiconductor regions made of second-conductive-type wide bandgap semiconductor, at least part of the third semiconductor regions are connected to the second semiconductor regions, the third semiconductor regions being interposed between the first semiconductor regions, the third semiconductor regions having width smaller than that of the second semiconductor regions;
    a first electrode formed on the first and second semiconductor regions; and
    a second electrode formed on a lower surface of the semiconductor substrate, wherein,
    a direction in which a longitudinal direction of the third semiconductor regions are projected onto a (0001) plane of the semiconductor layer has an angle of 90±30 degrees with respect to a <11-20> direction of the semiconductor layer, and
    a gap between the third semiconductor regions is not lower than 2d×tan 18°, where d is a thickness of the semiconductor layer.

2. The device according to claim 1, wherein
    the semiconductor layer has an impurity concentration of 1E+14 atoms/cm$^3$ to 5E+16 atoms/cm$^3$ and a thickness d of 20 μm or more, and
    the second semiconductor regions have a width of 15 μm or more.

3. The device according to claim 2, wherein the second semiconductor regions have a width of 36 μm or more.

4. The device according to claim 1, wherein a gap between the third semiconductor regions is not lower than 2d×tan 22°, where d is a thickness of the semiconductor layer.

5. The device according to claim 1, wherein
    the first electrode and the first semiconductor regions are Schottky-connected, the first electrode and the second semiconductor regions are ohmic-connected, and the first electrode and the third semiconductor regions are ohmic-connected.

6. The device according to claim 1, wherein the wide bandgap semiconductor is silicon carbide, and the first conductive type is an n type.

7. The device according to claim 1, further comprising a RESURF region made of first-conductive-type wide bandgap semiconductor, the RESURF region being formed at a surface of the semiconductor layer, the RESURF region being located outside the second semiconductor regions while the first semiconductor regions being interposed between the second semiconductor regions and the RESURF region, the RESURF region having a width larger than that of the second semiconductor regions, the RESURF region having an impurity concentration and a depth, which are substantially equal to those of the second semiconductor regions.

8. The device according to claim 7, wherein the first electrode is formed on the RESURF region.

9. The device according to claim 1, wherein the second semiconductor regions and the third semiconductor regions contain Al (aluminum) or B (boron) as an impurity.

10. The device according to claim 1, wherein the first electrode and the second electrode contain nickel (Ni).

11. A semiconductor rectifying device comprising:

a semiconductor layer made of hexagonal first-conductive-type wide bandgap semiconductor;

a first semiconductor regions made of first-conductive-type wide bandgap semiconductor, the first semiconductor regions being formed at a surface of the semiconductor layer;

second semiconductor regions made of second-conductive-type wide bandgap semiconductor, the second semiconductor regions being interposed between the first semiconductor regions;

third semiconductor regions made of second-conductive-type wide bandgap semiconductor, at least part of the third semiconductor regions are connected to the second semiconductor regions, the third semiconductor regions being interposed between the first semiconductor regions, the third semiconductor regions having width smaller than that of the second semiconductor regions;

a first electrode formed on the first and second semiconductor regions; and a second electrode formed on a lower surface of the semiconductor substrate, wherein, a direction in which a longitudinal direction of the third semiconductor regions are projected onto a (0001) plane of the semiconductor layer has an angle of 90±30 degrees with respect to a <11-20> direction of the semiconductor layer, and a gap between the third semiconductor regions is not lower than 2d×tan 18°, where d is a thickness of the semiconductor layer.

12. The device according to claim 11, wherein the semiconductor layer has an impurity concentration of 1E+14 atoms/cm$^3$ to 5E+16 atoms/cm$^3$ and a thickness d of 20 μm or more, and the second semiconductor regions have a width of 15 μm or more.

13. The device according to claim 12, wherein the second semiconductor regions have a width of 36 μm or more.

14. The device according to claim 11, wherein a gap between the third semiconductor regions is not lower than 2d×tan 22°, where d is a thickness of the semiconductor layer.

15. The device according to claim 11, wherein the first electrode and the first semiconductor regions are Schottky-connected, the first electrode and the second semiconductor regions are ohmic-connected, and the first electrode and the third semiconductor regions are ohmic-connected.

16. The device according to claim 11, wherein the wide bandgap semiconductor is silicon carbide, and the first conductive type is an n type.

17. The device according to claim 11, further comprising a RESURF region made of first-conductive-type wide bandgap semiconductor, the RESURF region being formed at a surface of the semiconductor layer, the RESURF region being located outside the second semiconductor regions while the first semiconductor region being interposed between the second semiconductor regions and the RESURF region, the RESURF region having a width larger than that of the second semiconductor regions, the RESURF region having an impurity concentration and a depth, which are substantially equal to those of the second semiconductor regions.

18. The device according to claim 17, wherein the first electrode is formed on the RESURF region.

19. The device according to claim 11, wherein the second semiconductor regions and the third semiconductor regions contain Al (aluminum) or B (boron) as an impurity.

20. The device according to claim 11, wherein the first electrode and the second electrode contain nickel (Ni).

* * * * *